(12) United States Patent
Sonehara et al.

(10) Patent No.: US 12,142,486 B2
(45) Date of Patent: Nov. 12, 2024

(54) NONVOLATILE SEMICONDUCTOR MEMORY DEVICE AND METHOD OF MANUFACTURING THE SAME

(71) Applicant: Kioxia Corporation, Tokyo (JP)

(72) Inventors: Takeshi Sonehara, Yokkaichi (JP); Takahiro Hirai, Yokkaichi (JP); Masaaki Higuchi, Yokkaichi (JP); Takashi Shimizu, Kashiwa (JP)

(73) Assignee: Kioxia Corporation, Tokyo (JP)

( * ) Notice: Subject to any disclaimer, the term of this patent is extended or adjusted under 35 U.S.C. 154(b) by 0 days.

(21) Appl. No.: 18/479,871

(22) Filed: Oct. 3, 2023

(65) Prior Publication Data

US 2024/0030040 A1    Jan. 25, 2024

Related U.S. Application Data

(60) Division of application No. 17/183,599, filed on Feb. 24, 2021, now abandoned, which is a continuation of application No. 16/809,728, filed on Mar. 5, 2020, now Pat. No. 10,957,556, which is a continuation of application No. 16/235,435, filed on Dec. 28, 2018, (Continued)

(51) Int. Cl.
*H01L 21/321* (2006.01)
*H10B 43/27* (2023.01)

(52) U.S. Cl.
CPC ....... *H01L 21/32105* (2013.01); *H10B 43/27* (2023.02)

(58) Field of Classification Search
CPC .......................... H01L 21/32105; H10B 43/27
See application file for complete search history.

(56) References Cited

U.S. PATENT DOCUMENTS 7,919,809 B2    4/2011    Lee et al.
8,008,732 B2    8/2011    Kiyotoshi et al.
(Continued)

FOREIGN PATENT DOCUMENTS

JP    2008-78404    4/2008
JP    2009-289813    12/2009
(Continued)

*Primary Examiner* — Dale E Page
*Assistant Examiner* — Quovaunda Jefferson
(74) *Attorney, Agent, or Firm* — Oblon, McClelland, Maier & Neustadt, L.L.P.

(57) ABSTRACT

According to an embodiment, a nonvolatile semiconductor memory device comprises a plurality of conductive layers that are stacked in plurality in a first direction via an inter-layer insulating layer, that extend in a second direction which intersects the first direction, and that are disposed in plurality in a third direction which intersects the first direction and the second direction. In addition, the same nonvolatile semiconductor memory device comprises: a semiconductor layer that has the first direction as a longitudinal direction; a tunnel insulating layer that contacts a side surface of the semiconductor layer; a charge accumulation layer that contacts a side surface of the tunnel insulating layer; and a block insulating layer that contacts a side surface of the charge accumulation layer. Furthermore, in the same nonvolatile semiconductor memory device, an end in the third direction of the plurality of conductive layers is rounded.

13 Claims, 28 Drawing Sheets

Related U.S. Application Data now Pat. No. 10,615,049, which is a continuation of application No. 14/844,382, filed on Sep. 3, 2015, now Pat. No. 10,192,753.

(60) Provisional application No. 62/050,335, filed on Sep. 15, 2014.

(56) References Cited

U.S. PATENT DOCUMENTS

| | | | |
|---|---|---|---|
| 8,258,033 B2* | 9/2012 | Watanabe | H10B 43/27 |
| | | | 438/283 |
| 8,431,969 B2 | 4/2013 | Kim et al. | |
| 9,831,269 B2 | 11/2017 | Kamigaichi | |
| 2009/0173981 A1 | 7/2009 | Nitta | |
| 2009/0283819 A1 | 11/2009 | Ishikawa et al. | |
| 2010/0207190 A1 | 8/2010 | Katsumata et al. | |
| 2011/0018052 A1 | 1/2011 | Fujiwara | |
| 2011/0298033 A1 | 12/2011 | Matsunami et al. | |
| 2011/0303971 A1 | 12/2011 | Lee et al. | |
| 2012/0003831 A1* | 1/2012 | Kang | H10B 43/20 |
| | | | 257/E21.645 |
| 2012/0049268 A1 | 3/2012 | Chang et al. | |
| 2012/0098051 A1 | 4/2012 | Son et al. | |
| 2013/0032874 A1* | 2/2013 | Ko | H10B 43/40 |
| | | | 257/E21.09 |
| 2017/0084618 A1* | 3/2017 | Peri | H10B 43/35 |

FOREIGN PATENT DOCUMENTS

| | | |
|---|---|---|
| JP | 2011-40533 | 2/2011 |
| JP | 2011-171735 | 9/2011 |
| JP | 2011-527833 | 11/2011 |
| JP | 2012-15301 | 1/2012 |
| JP | 2013-38186 | 2/2013 |

* cited by examiner

NONVOLATILE SEMICONDUCTOR MEMORY DEVICE AND METHOD OF MANUFACTURING THE SAME

CROSS-REFERENCE TO RELATED APPLICATIONS

This application is a division of and claims the benefit of priority under 35 U.S.C. § 120 from U.S. application Ser. No. 17/183,599 filed Feb. 24, 2021, which is a continuation of U.S. application Ser. No. 16/809,728 filed Mar. 5, 2020 (now U.S. Pat. No. 10,957,556 issued Mar. 23, 2021), which is a continuation of U.S. application Ser. No. 16/235,435 filed Dec. 28, 2018 (now U.S. Pat. No. 10,615,049 issued Apr. 7, 2020), which is a continuation of U.S. application Ser. No. 14/844,382 filed Sep. 3, 2015 (now U.S. Pat. No. 10,192,753 issued Jan. 29, 2019), which is based upon and claims the benefit of U.S. Provisional Patent Application No. 62/050,335 filed Sep. 15, 2014, the entire contents of each of which are incorporated herein by reference.

FIELD

Embodiments described here relate to a nonvolatile semiconductor memory device and a method of manufacturing the same.

BACKGROUND

Description of the Related Art

A memory cell configuring a nonvolatile semiconductor memory device such as a NAND type flash memory includes a semiconductor layer, a control gate, and a charge accumulation layer. The memory cell changes its threshold voltage according to a charge accumulated in the charge accumulation layer and stores a magnitude of this threshold voltage as data. In recent years, enlargement of capacity and raising of integration level has been proceeding in such a nonvolatile semiconductor memory device. Moreover, a nonvolatile semiconductor memory device in which the memory cells are three-dimensionally disposed (a three-dimensional type semiconductor memory device) has been proposed to raise integration level of the memory.

DETAILED DESCRIPTION

A nonvolatile semiconductor memory device according to an embodiment described below comprises a plurality of conductive layers that are stacked in plurality in a first direction via an inter-layer insulating layer, that extend in a second direction which intersects the first direction, and that are disposed in plurality in a third direction which intersects the first direction and the second direction. In addition, the same nonvolatile semiconductor memory device comprises: a semiconductor layer that has the first direction as a longitudinal direction; a tunnel insulating layer that contacts a side surface of the semiconductor layer; a charge accumulation layer that contacts a side surface of the tunnel insulating layer; and a block insulating layer that contacts aside surface of the charge accumulation layer. Furthermore, in the same nonvolatile semiconductor memory device, an end in the third direction of the plurality of conductive layers is rounded.

First Embodiment

Overall Configuration

Figure 1:
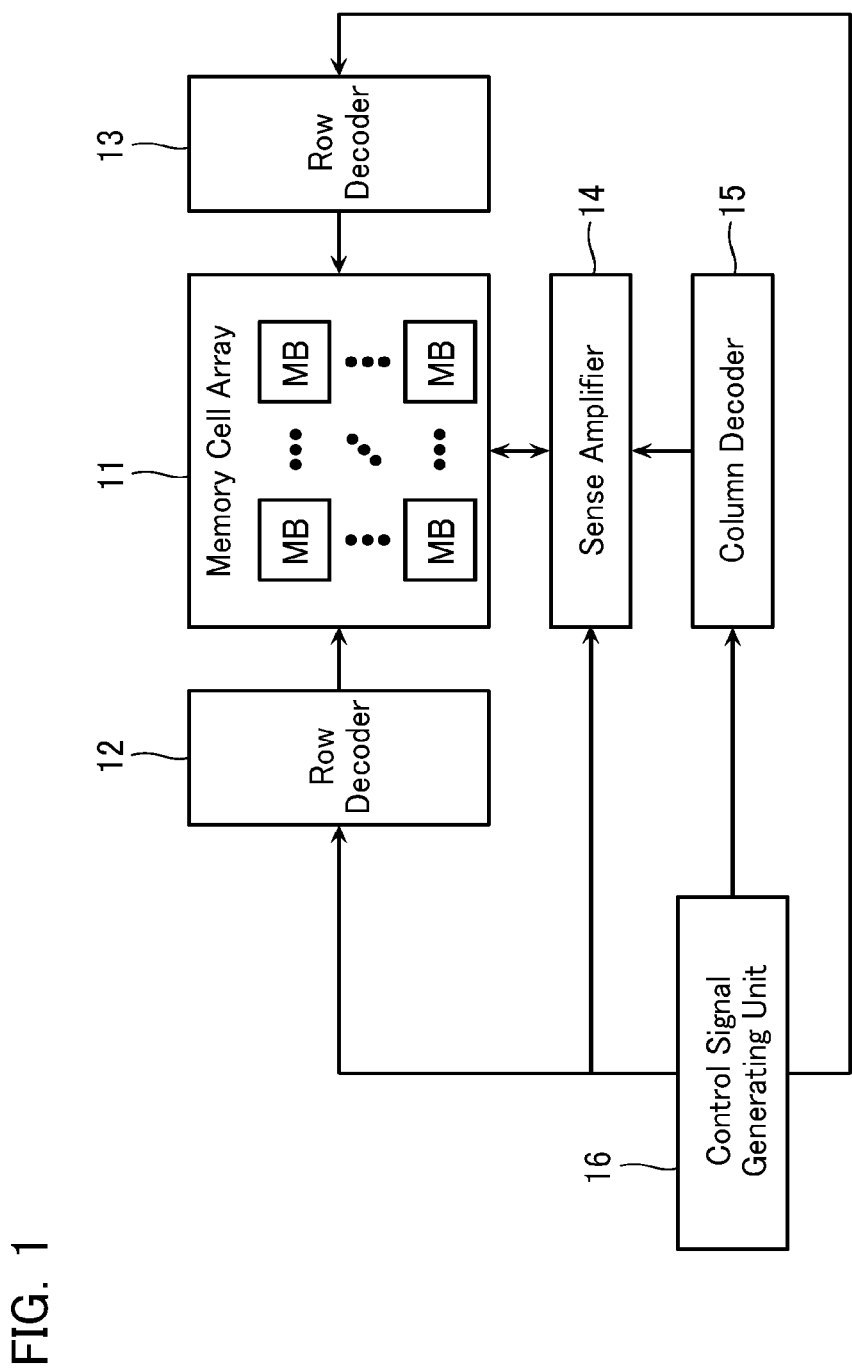
FIG. 1 is a block diagram showing a schematic configuration of a nonvolatile semiconductor memory device according to a first embodiment.

A configuration of a nonvolatile semiconductor memory device according to a first embodiment will be described below. FIG. 1 is a block diagram of the nonvolatile semiconductor memory device according to the first embodiment.

As shown in FIG. 1, the nonvolatile semiconductor memory device according to the first embodiment comprises: a memory cell array 11; row decoders 12 and 13; a sense amplifier 14; a column decoder 15; and a control signal generating unit 16. The row decoders 12 and 13, the sense amplifier 14, the column decoder 15 and the control signal generating unit 16 control read and write of this memory cell array 11;

The memory cell array 11 is configured from a plurality of memory blocks MB. Each of the memory blocks MB includes a plurality of memory transistors MTr arranged three-dimensionally therein and each storing data in a nonvolatile manner. Moreover, the memory block MB configures a minimum erase unit of batch erase when executing a data erase operation. The memory transistors MTr are disposed in a matrix (three-dimensionally) in a row direction, a column direction, and a stacking direction.

As shown in FIG. 1, the row decoders 12 and 13 decode the likes of a down-loaded block address signal, and control the memory cell array 11. The sense amplifier 14 reads data from the memory cell array 11. The column decoder 15 decodes a column address signal and controls the sense amplifier 14. The control signal generating unit 16 boosts a reference voltage to generate a high voltage required during write or erase, and furthermore generates a control signal, and controls the row decoders 12 and 13, the sense amplifier 14, and the column decoder 15.

Figure 2:
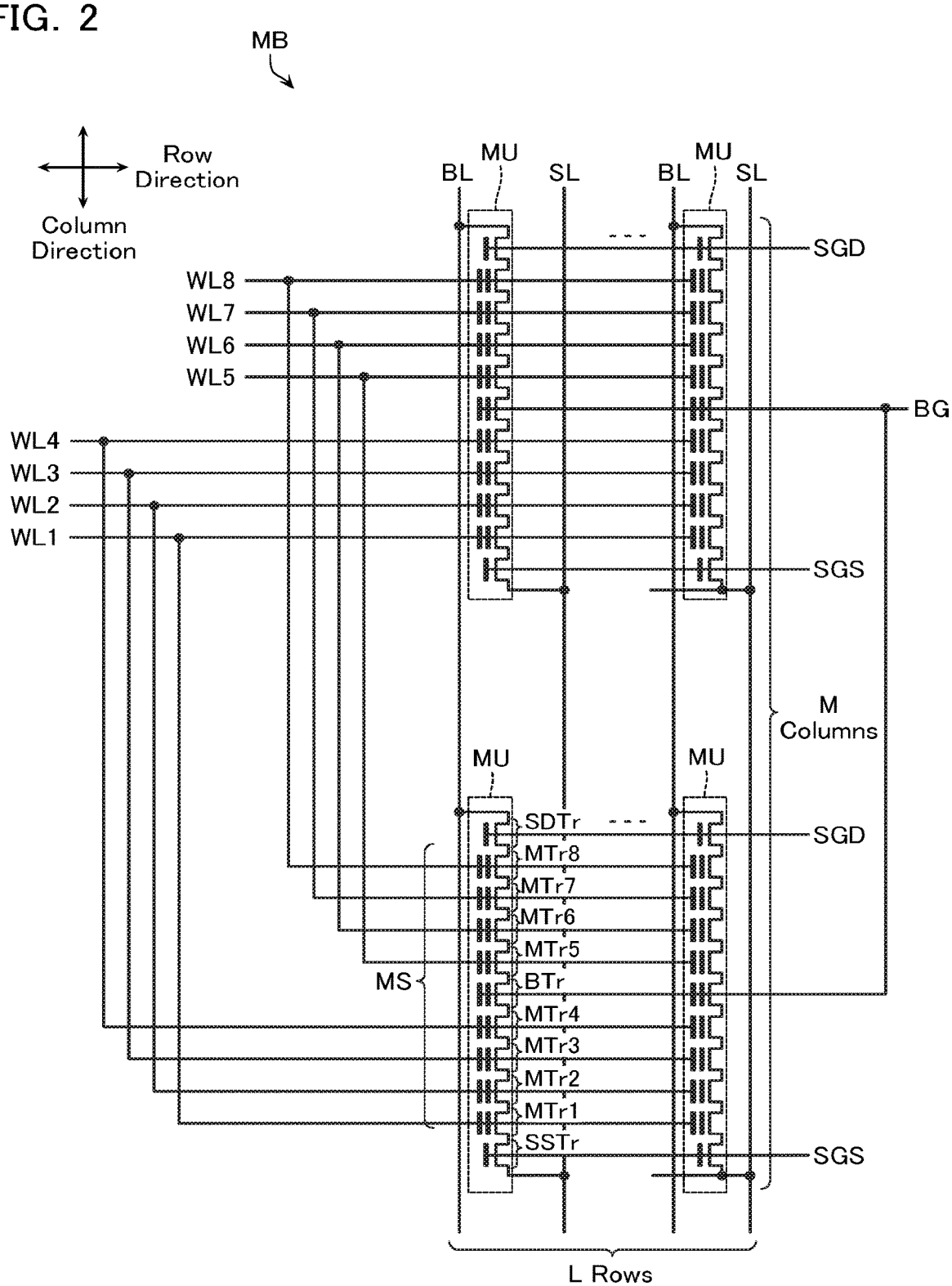
FIG. 2 is a circuit diagram showing a configuration of part of the same nonvolatile semiconductor memory device.

Next, a specific configuration of the memory block MB will be described with reference to FIG. 2. FIG. 2 is a circuit diagram for explaining the specific configuration of the memory block MB. The memory block MB includes a plurality of bit lines BL, a plurality of source lines SL, and a plurality of memory units MU connected to these bit lines BL and source lines SL.

The memory unit MU configures a NAND type flash memory, and is configured having a source side select transistor SSTr and a drain side select transistor SDTr respectively connected to both ends of a memory string MS, the memory string MS being configured from memory transistors MTr1 to MTr8 and a back gate transistor BTr connected in series. The memory transistors MTr1 to MTr8 change their threshold voltage by accumulating a charge in their charge accumulation layer, and store data corresponding to this threshold voltage.

Drains of the drain side select transistors SDTr of a plurality of the memory units MU aligned in the column direction are connected to a common bit line BL. Sources of the source side select transistors SSTr of a plurality of the memory units MU aligned in the column direction are connected to a common source line SL. Gates of each of the memory transistors MTr1 to MTr8 are respectively connected to word lines WL1 to WL8. A back gate line BG is commonly connected to gates of the back gate transistors BTr. A source side select gate line SGS is connected to gates of the source side select transistors SSTr, and a drain side select gate line SGD is connected to gates of the drain side select transistors SDTr.

[Memory Cell Array 11]

Figure 3:
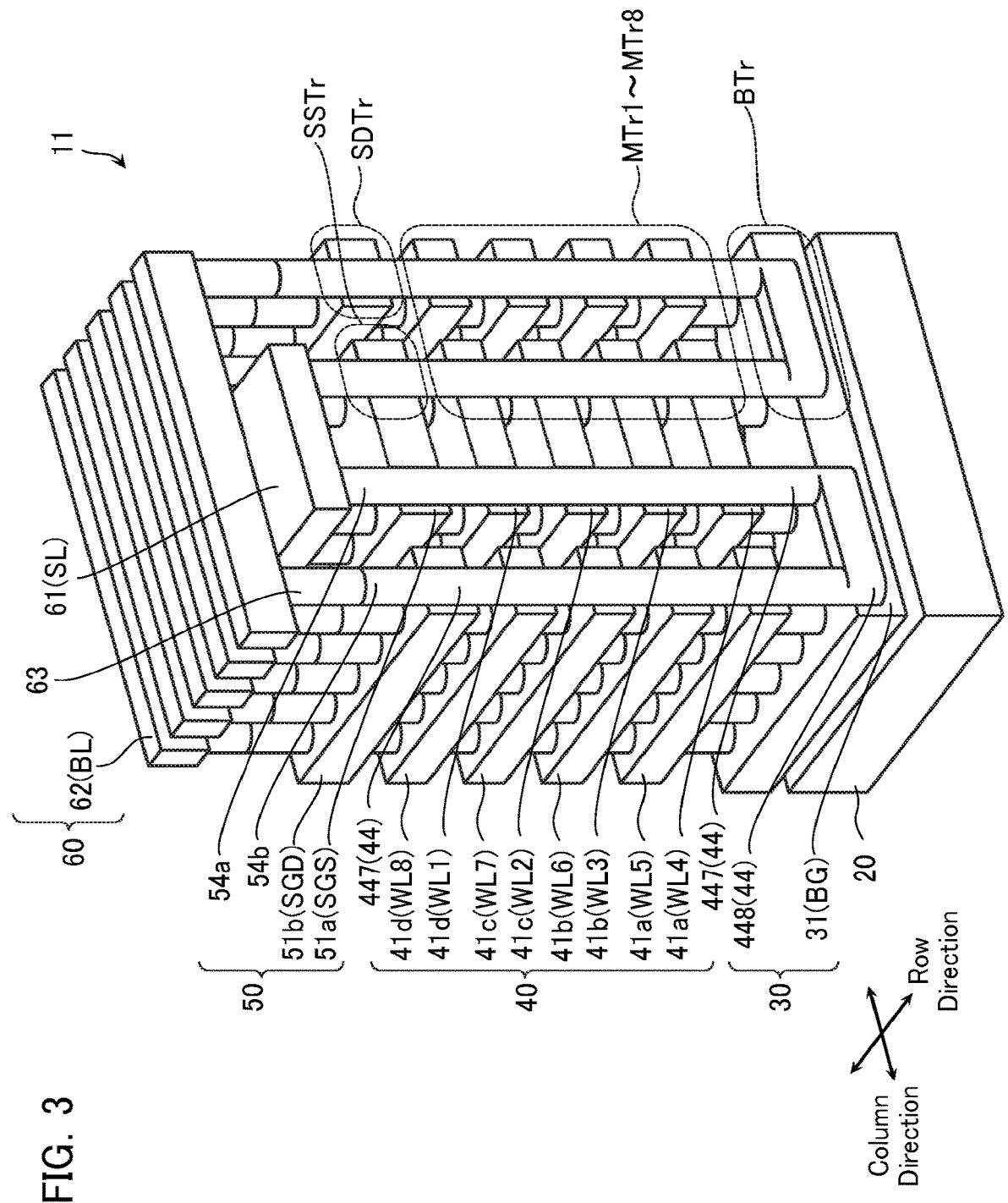
FIG. 3 is a schematic perspective view showing a configuration of part of the same nonvolatile semiconductor memory device.
Figure 4:
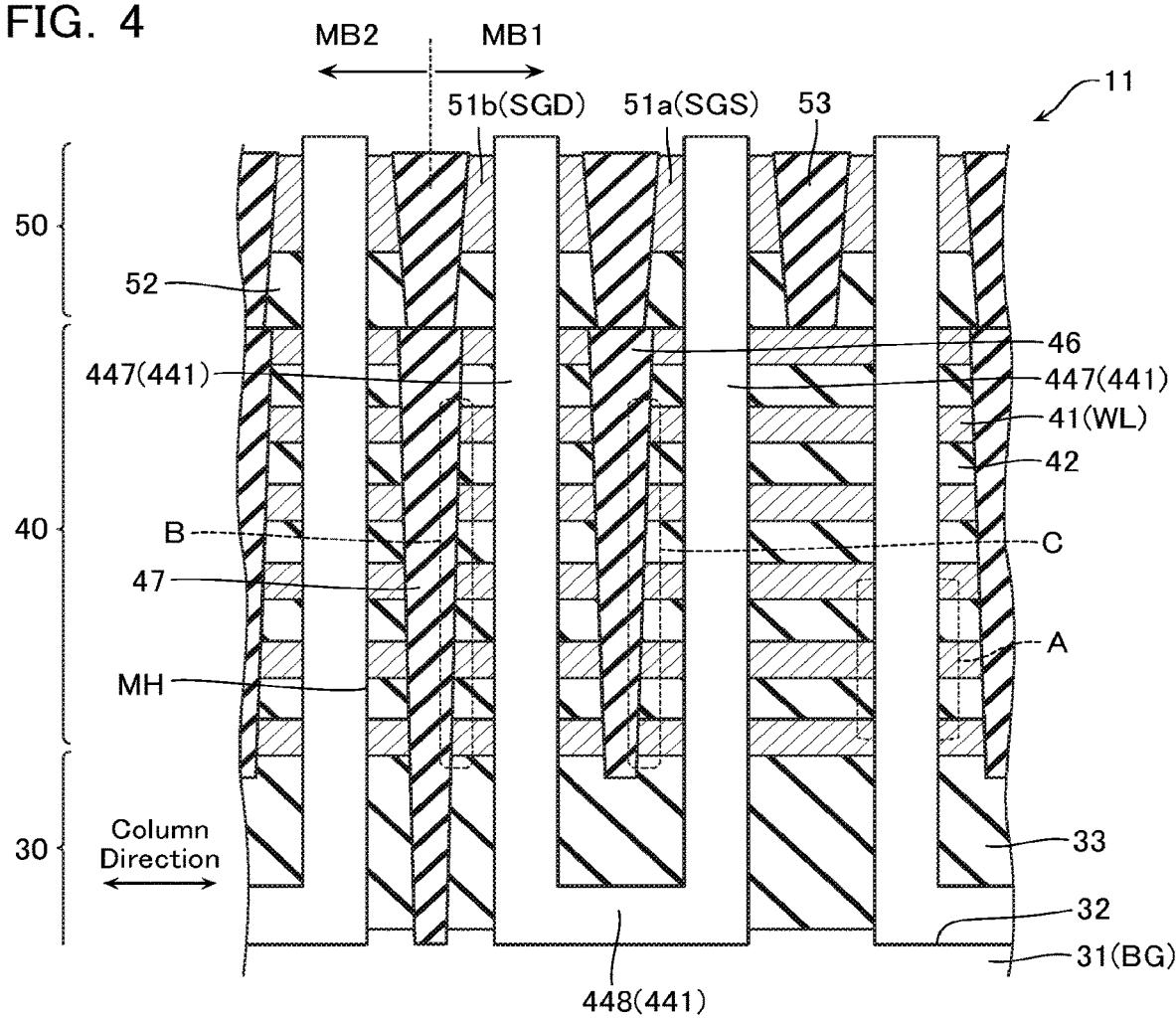
FIG. 4 is a schematic cross-sectional view showing a configuration of part of the same nonvolatile semiconductor memory device.
Figure 5:
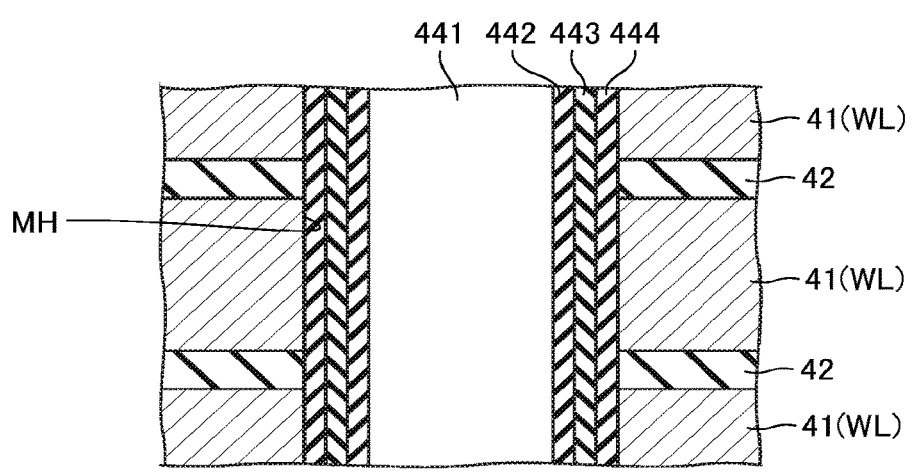
FIG. 5 is a schematic cross-sectional view showing a configuration of part of the same nonvolatile semiconductor memory device.
Figure 6:
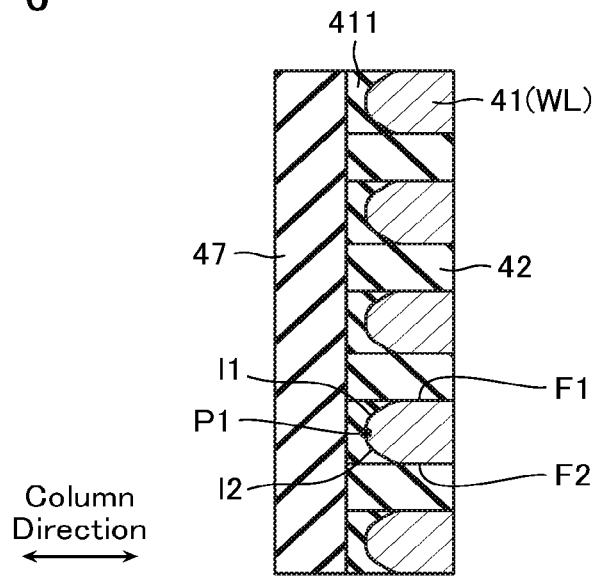
FIG. 6 is a schematic cross-sectional view showing a configuration of part of the same nonvolatile semiconductor memory device.
Figure 7:
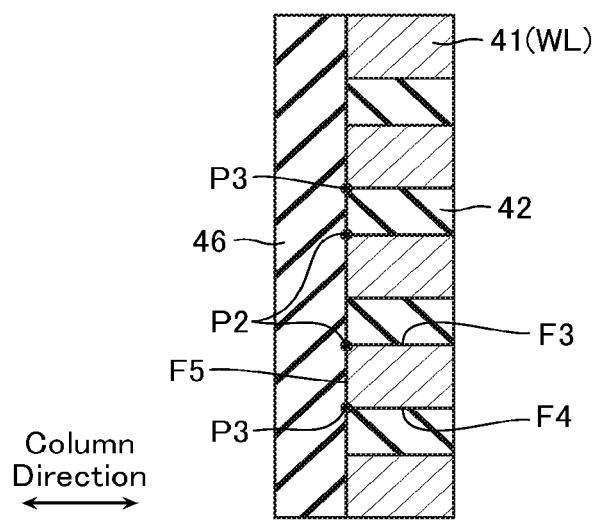
FIG. 7 is a schematic cross-sectional view showing a configuration of part of the same nonvolatile semiconductor memory device.

Next, a structure of the memory cell array 11 according to the first embodiment will be described with reference to FIGS. 3 to 7. FIG. 3 is a perspective view illustrating part of the memory cell array 11. FIG. 4 is a cross-sectional view illustrating part of the memory cell array 11. Moreover, FIG. 5 is an enlarged view of a portion indicated by A of FIG. 4; FIG. 6 is an enlarged view of a portion indicated by B of FIG. 4; and FIG. 7 is an enlarged view of a portion indicated by C of FIG. 4.

Note that below, a memory cell array 11 having a Metal/Oxide/Nitride/Oxide/Silicon structure (MONOS structure) or a Silicon/Oxide/Nitride/Oxide/Silicon structure (SONOS structure) will be described as an example. However, it is also possible to adopt a memory cell array having a Floating Gate structure.

As shown in FIG. 3, the memory cell array 11 includes a back gate layer 30, a memory layer 40, a select transistor layer 50, and a wiring line layer 60 that are stacked sequentially on a substrate 20. The back gate layer 30 functions as the back gate transistor BTr. The memory layer 40 functions as the memory transistors MTr1 to MTr8. The select transistor layer 50 functions as the drain side select transistor SDTr and the source side select transistor SSTr. The wiring line layer 60 functions as the source line SL and the bit line BL.

As shown in FIG. 3, the back gate layer 30 includes a back gate conductive layer 31. The back gate conductive layer 31 functions as the back gate line BG and as the gate of the back gate transistor BTr. The back gate conductive layer 31 is formed so as to extend in a plate shape, two-dimensionally, in the row direction and the column direction parallel to the substrate 20.

As shown in FIG. 4, the back gate layer 30 includes a back gate hole 32. The back gate hole 32 is formed so as to dig in to the back gate conductive layer 31.

As shown in FIGS. 3 and 4, the memory layer 40 is formed in a layer above the back gate layer 30. The memory layer 40 includes a plurality of layers (in FIG. 3, four layers) of word line conductive layers 41a to 41d. The word line conductive layer 41a functions as the word line WL4 and as the gate of the memory transistor MTr4. In addition, the word line conductive layer 41a functions as the word line WL5 and as the gate of the memory transistor MTr5. Similarly, the word line conductive layers 41b to 41d respectively function as the word lines WL1 to WL3 and WL6 to WL8 and as the gates of the memory transistors MTr1 to MTr3 and MTr6 to MTr8. Moreover, as shown in FIG. 4, an inter-layer insulating layer 42 is formed between the word line conductive layers 41, above and below.

The word line conductive layers 41 are disposed with a certain pitch in the column direction. Moreover, the word line conductive layers 41 are formed so as to extend having the row direction (a direction perpendicular to the plane of paper in FIG. 4) as a longitudinal direction.

As shown in FIG. 4, the memory layer 40 includes a memory hole MH. The memory hole MH is formed so as to penetrate the word line conductive layers 41a to 41d and the inter-layer insulating layers 42. The memory hole MH is formed so as to be aligned with close to an end in the column direction of the back gate hole 32.

Moreover, as shown in FIG. 4, the back gate layer 30 and the memory layer 40 comprise a memory semiconductor layer 441. The memory semiconductor layer 441 functions as a body (channel) of the memory string MS (memory transistors MTr1 to MTr8) and the back gate transistor BTr.

In addition, as shown in FIG. 5, the back gate layer 30 and the memory layer 40 include: a tunnel insulating layer 442 that covers the memory semiconductor layer 441; a charge accumulation layer 443 that covers the tunnel insulating layer 442; and a block insulating layer 444 that covers the charge accumulation layer 443. The charge accumulation layer 443 is configured capable of accumulating a charge.

As shown in FIG. 4, the memory semiconductor layer 441, the tunnel insulating layer 442, the charge accumulation layer 443, and the block insulating layer 444 are formed so as to fill the back gate hole 32 and the memory hole MH. The memory semiconductor layer 441 includes a pair of columnar portions 447 extending in a direction perpendicular to the substrate 20, and a coupling portion 448 that couples the pair of columnar portions 447 at lower ends thereof. The memory semiconductor layer 441 is formed in a U shape as viewed from the row direction.

The above-described back gate layer 30 is formed so as to surround a side surface of the coupling portion 448. Moreover, the word line conductive layers 41a to 41d are formed so as to surround a side surface of the columnar portion 447.

In addition, as shown in FIG. 3, an upper portion of one of the columnar portions 447 is surrounded by a source side conductive layer 51a functioning as the source side select gate line SGS, and functions as a channel of the source side select transistor SSTr. Similarly, an upper portion of the other of the columnar portions 447 is surrounded by a drain side conductive layer 51b functioning as the drain side select gate line SGD, and functions as a channel of the drain side select transistor SDTr.

Furthermore, as shown in FIG. 3, the upper portion of the one of the columnar portions 447 is connected to a source line layer 61 functioning as the source line SL. Moreover, the upper portion of the other of the columnar portions 447 is connected, via a plug layer 63, to a bit line layer 62 functioning as the bit line BL.

In addition, as shown in FIG. 4, the word line conductive layers 41 configuring different memory blocks MB are divided in the column direction via an insulating layer 47. Furthermore, as shown in FIG. 4, the word line conductive layer 41 positioned in a periphery of one of the columnar portions 447 and the word line conductive layer 41 positioned in a periphery of the other of the columnar portions 447, of the pair of columnar portions 447 connected by the coupling portion 448, are divided in the column direction by an insulating layer 46.

As shown in FIG. 6, in a periphery of the insulating layer 47, an end in the column direction of the word line conductive layer 41 is rounded. That is, a curve 11 joining a tip P1 in the column direction of the word line conductive layer 41 and an upper surface F1 of the word line conductive layer 41 is an upwardly convex curve. Similarly, a curve 12 joining the tip P1 in the column direction of the word line conductive layer 41 and a lower surface F2 of the word line conductive layer 41 is a downwardly convex curve. The curves 11 and 12 have a width of 1 nm or more in the stacking direction. Moreover, in the present embodiment, the curves 11 and 12 have a curvature, and a radius of curvature of these curves 11 and 12 is 20 nm or more. Note that the curves 11 and 12 may be curves approximated to a cross-sectional image of the word line conductive layer 41.

In addition, as shown in FIG. 6, an oxide portion 411 contacting the tip P1 in the column direction of the word line conductive layer 41 is formed between the word line conductive layer 41 and the insulating layer 47.

As shown in FIG. 7, in a periphery of the insulating layer 46, an end in the column direction of the word line conductive layer 41 is not rounded. That is, an end surface F5 in the column direction of the word line conductive layer 41 is a planar surface. Moreover, the end surface F5 intersects an upper surface F3 of the word line conductive layer 41 at substantially a single point P2. Similarly, the end surface F5 intersects a lower surface F4 of the word line conductive layer 41 at substantially a single point P3. Note that in the present embodiment, the end in the column direction of the word line conductive layer 41 in the periphery of the insulating layer 46 is not rounded. However, as will be mentioned later, the end in the column direction of the word line conductive layer 41 in the periphery of the insulating layer 46 may be rounded.

[Material of Each Configuration in Memory Cell Array 11]

The back gate conductive layer 31 and the memory semiconductor layer 441 are conceivably configured from, for example, a semiconductor such as Si, SiGe, SiC, Ge, C, and so on.

The charge accumulation layer 443 is formed from, for example, silicon nitride (SiN).

The tunnel insulating layer 442 and the block insulating layer 444 are conceivably configured, from, for example, a material such as an oxide or an oxynitride, and so on.

Conceivable as the oxide configuring the tunnel insulating layer 442 and the block insulating layer 444 are, for example, $SiO_2$, $Al_2O_3$, $Y_2O_3$, $La_2O_3$, $Gd_2O_3$, $Ce_2O_3$, $CeO_2$, $Ta_2O_5$, $HfO_2$, $ZrO_2$, $TiO_2$, HfSiO, HfAlO, ZrSiO, ZrAlO, AlSiO, and so on.

Moreover, the oxide configuring the tunnel insulating layer 442 and the block insulating layer 444 may be $AB_2O_4$. Note that the A and B referred to here are the same or different elements, and are each one of Al, Sc, Ti, V, Cr, Mn, Fe, Co, Ni, Cu, Zn, Ga, and Ge. For example, $AB_2O_4$ is $Fe_3O_4$, $FeAl_2O_4$, $Mn_{1+x}Al_{2-x}O_{4+y}$, $Co_{1+x}Al_{2-x}O_{4+y}$, $MnO_x$, and so on.

Moreover, the oxide configuring the tunnel insulating layer 442 and the block insulating layer 444 may be $ABO_3$. Note that the A and B referred to here are the same or different elements, and are each one of Al, La, Hf, Ta, W, Re, Os, Ir, Pt, Au, Hg, Tl, Pb, Bi, Ce, Pr, Nd, Pm, Sm, Eu, Gd, Tb, Dy, Ho, Er, Tm, Yb, Lu, Sc, Ti, V, Cr, Mn, Fe, Co, Ni, Cu, Zn, Ga, Ge, Y, Zr, Nb, Mo, Tc, Ru, Rh, Pd, Ag, Cd, In, and Sn. For example, $ABO_3$ is $LaAlO_3$, $SrHfO_3$, $SrZrO_3$, $SrTiO_3$, and so on.

Conceivable as the oxynitride configuring the tunnel insulating layer 442 and the block insulating layer 444 are, for example, SiON, AlON, YON, LaON, GdON, CeON, TaON, HfON, ZrON, TiON, LaAlON, SrHfON, SrZrON, SrTiON, HfSiON, HfAlON, ZrSiON, ZrAlON, AlSiON, and so on.

Moreover, the oxynitride configuring the tunnel insulating layer 442 and the block insulating layer 444 may be a material in which an oxygen element portion of each of the materials described above as the oxide configuring the tunnel insulating layer 442 and the block insulating layer 444 is substituted by a nitrogen element.

Note that the following are preferred as the material of the tunnel insulating layer 442 and the block insulating layer 444, namely, $SiO_2$, SiN, $Si_3N_4$, $Al_2O_3$, SiON, $HfO_2$, HfSiON, $Ta_2O_5$, $TiO_2$, or $SrTiO_3$.

In particular, an Si based insulating film such as $SiO_2$, SiN, SiON, and so on, includes one in which concentrations of oxygen elements or nitrogen elements are each $1 \times 10^{18}$ atoms/cm$^3$ or more. Note that barrier heights of a plurality of insulating layers differ from each other.

Moreover, the tunnel insulating layer 442 and the block insulating layer 444 may include impurity atoms forming a defect level, or semiconductor/metal dots (quantum dots).

The word line conductive layer 41 and the bit line layer 62 are conceivably configured, from, for example, a conductive layer of the likes of W, WN, Al, Ti, V, Cr, Mn, Fe, Co, Ni, Cu, TiN, $WSi_x$, $TaSi_x$, $PdSi_x$, $ErSi_x$, $YSi_x$, $PtSi_x$, $HfSi_x$, $NiSi_x$, $CoSi_x$, $TiSi_x$, $VSi_x$, $CrSi_x$, $MnSi_x$, $FeSi_x$, and so on.

The insulating layer 46 and the insulating layer 47 are formed from, for example, silicon oxide ($SiO_2$) or silicon nitride (SiN), and so on.

The oxide portion 411 is configured from a material having insulation properties and obtained by oxidizing the material configuring the word line conductive layer 41.

Operation

Figure 8:
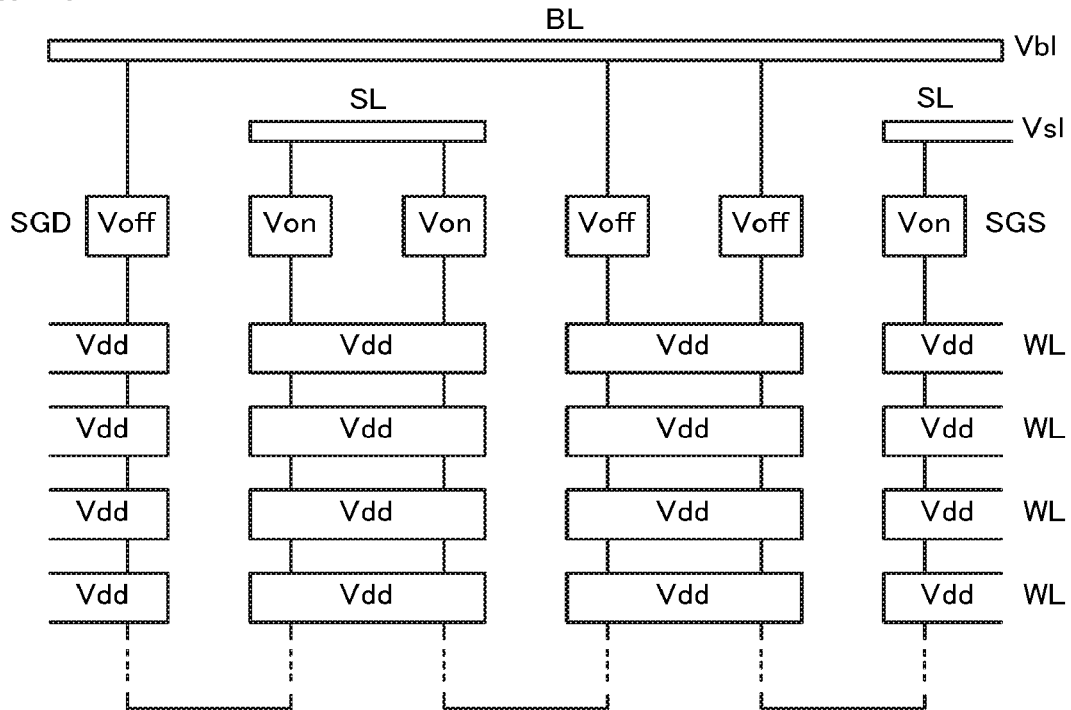
FIG. 8 is a schematic view for explaining a write operation of the same nonvolatile semiconductor memory device.
Figure 9:
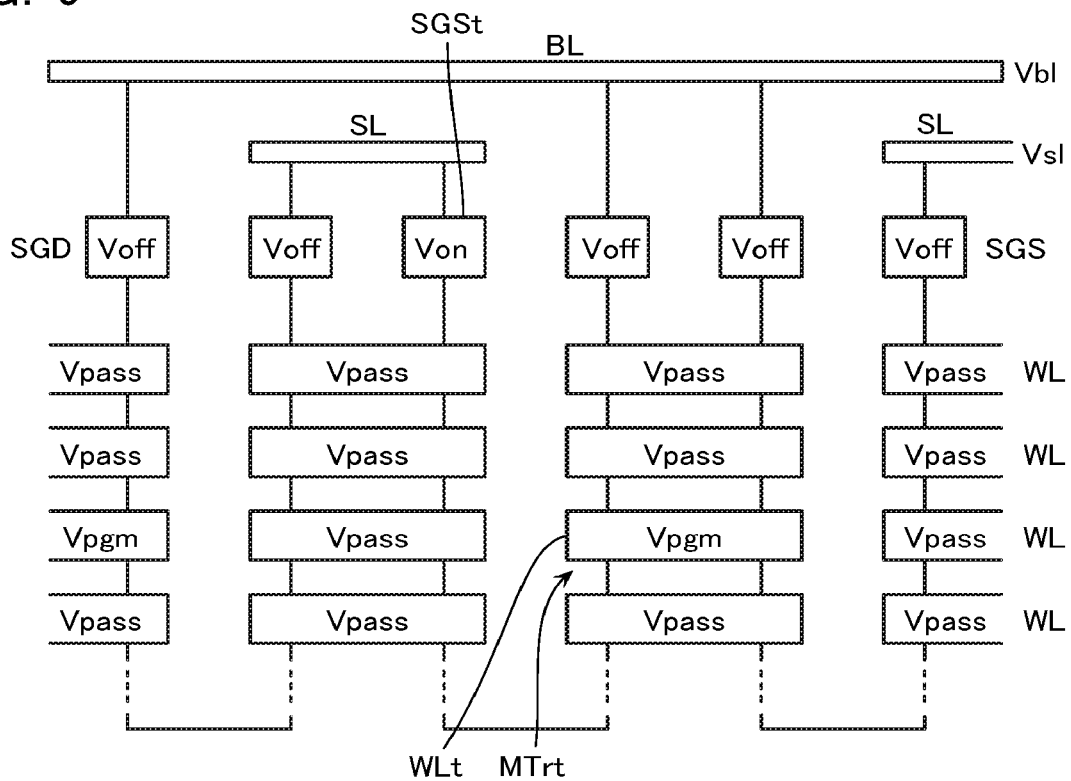
FIG. 9 is a schematic view for explaining the write operation of the same nonvolatile semiconductor memory device.

Next, operation of the nonvolatile semiconductor memory device according to the present embodiment will be described with reference to FIGS. 8 to 11. FIGS. 8 and 9 are schematic views for explaining a write operation of the nonvolatile semiconductor memory device according to the present embodiment.

As shown in FIG. 8, in the write operation, first, a voltage of the bit line BL is set to a bit line voltage Vbl. A voltage of the drain side select gate line SGD is set to Voff. Voltages of the word lines WL are all set to a boost voltage Vdd. A voltage of the source side select gate line SGS is set to Von. A voltage of the source line SL is set to a source line voltage Vsl. As a result, a channel is formed in the memory semiconductor layer 441 (FIG. 3), and the source line SL is electrically connected to the semiconductor layer 441 via the source side select transistor SSTr (FIG. 3).

Now, the bit line voltage Vbl is, for example, about 0.5 V. Moreover, the boost voltage Vdd is a voltage large enough to set the memory transistor MTr to an ON state regardless of a charge accumulated in the charge accumulation layer 443 of the memory transistor MTr. In addition, the boost voltage Vdd is a voltage of a degree substantially preventing occurrence of accumulation of charge to the charge accumulation layer 443 of the memory transistor MTr. Moreover, the source line voltage Vsl is, for example, a ground voltage.

Next, as shown in FIG. 9, a voltage of a selected word line WLt connected to a selected memory transistor MTrt that is to undergo a write is set to a program voltage Vpgm, and a voltage of another word line WL is set to a write pass voltage Vpass. A voltage of a selected source side select gate line SGSt connected to the selected memory transistor MTrt is set to Von, and a voltage of another source side select gate line SGS is set to Voff. As a result, electrons are supplied from the source line SL to the semiconductor layer 441 (FIG.

3), and electrons are injected into the charge accumulation layer 443 (FIG. 5) of the selected memory transistor MTrt via the tunnel insulating layer 442 (FIG. 5) and stored in the charge accumulation layer 443.

Now, the program voltage Vpgm is a voltage large enough for a charge to be accumulated in the charge accumulation layer 443 of the memory transistor MTr. In addition, the read pass voltage Vread is a voltage of a degree substantially preventing occurrence of accumulation of charge to the charge accumulation layer 443 of the memory transistor MTr.

Figure 10:
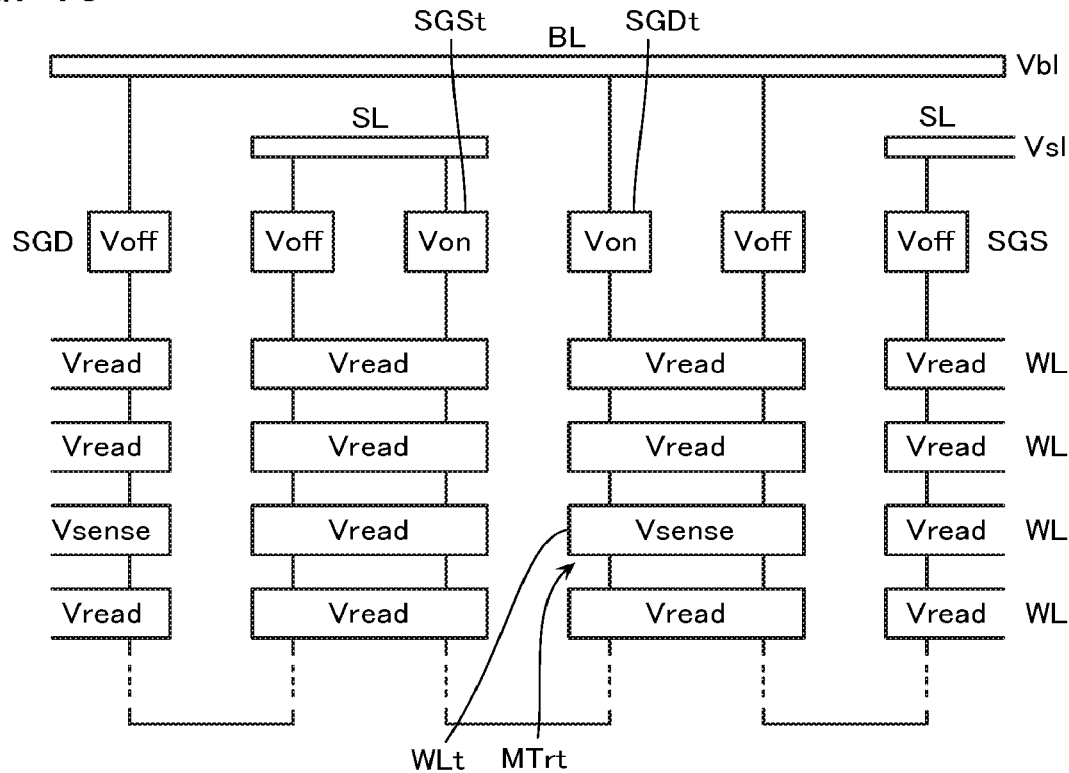
FIG. 10 is a schematic view for explaining a read operation of the same nonvolatile semiconductor memory device.

FIG. 10 is a schematic view for explaining a read operation of the nonvolatile semiconductor memory device according to the present embodiment.

As shown in FIG. 10, in the read operation, first, a voltage of the bit line BL is set to the bit line voltage Vbl. A voltage of a selected drain side select gate line SGDt connected to a selected memory transistor MTrt that is to undergo the read operation is set to Von, and a voltage of another drain side select gate line SGD is set to Voff. A voltage of a selected word line WLt connected to the selected memory transistor MTrt is set to a read voltage Vsense, and a voltage of another word line WL is set to a read pass voltage Vread. A voltage of a selected source side select gate line SGSt connected to the selected memory transistor MTrt is set to Von, and a voltage of another source side select gate line SGS is set to Voff. A voltage of the source line SL is set to the source line voltage Vsl.

As a result, a channel is formed in the semiconductor layer 441 (FIG. 3), and the source line SL is electrically connected to the semiconductor layer 441 via the source side select transistor SSTr (FIG. 3). Moreover, the selected memory transistor MTrt attains an ON state or an OFF state depending on data stored therein. Therefore, by detecting a current or voltage of the bit line BL, it is possible to determine data stored by the selected memory transistor MTrt.

Now, the read voltage Vsense is a voltage for determining a charge accumulated in the charge accumulation layer 443 of the selected memory transistor MTrt. Therefore, the selected memory transistor MTrt applied with the read voltage Vsense via the selected word line WLt attains an ON state or attains an OFF state depending on an amount of charge accumulated in the charge accumulation layer 443. Moreover, if, for example, each of the memory transistors MTr stores multi-value data, the read voltage Vsense is set in a plurality of stages.

The read pass voltage Vread is a voltage large enough to set the memory transistor MTr to an ON state regardless of a charge accumulated in the charge accumulation layer 443 of the memory transistor MTr. Therefore, the read pass voltage Vread is larger than the read voltage Vsense. Moreover, the read pass voltage Vread is a voltage of a degree substantially preventing occurrence of accumulation of charge to the charge accumulation layer 443 of the memory transistor MTr. Therefore, the read pass voltage Vread is smaller than the above-mentioned program voltage Vpgm. The read pass voltage Vread is, for example, about 6 V.

Figure 11:
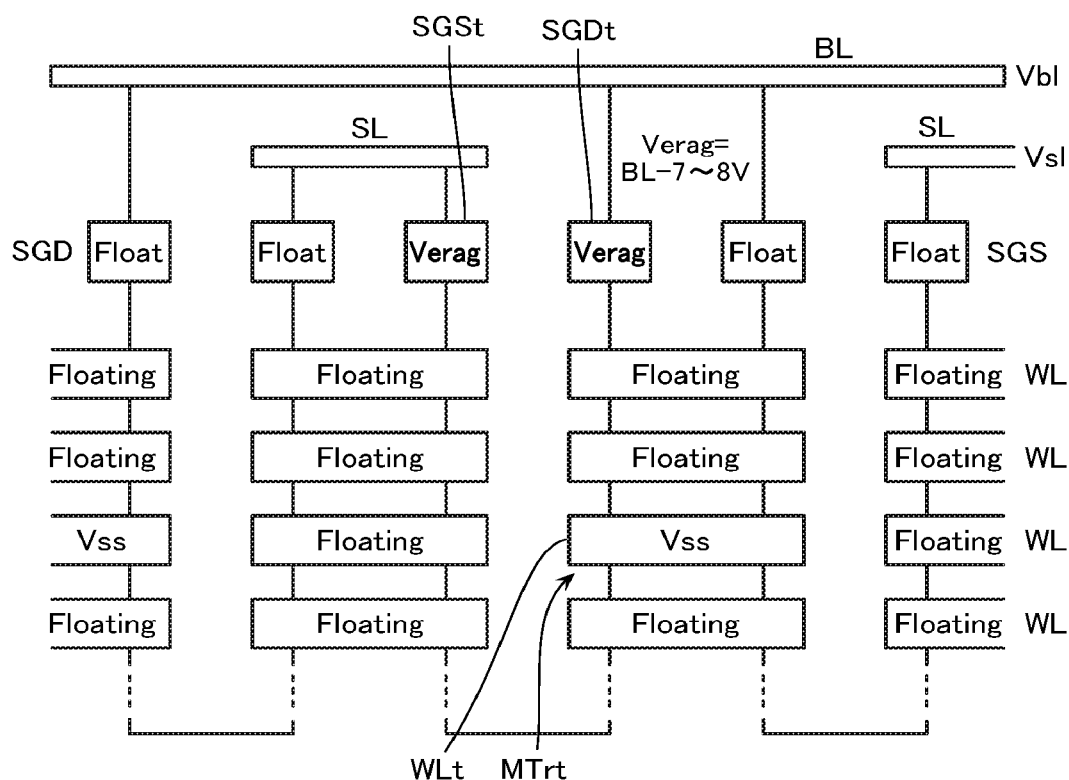
FIG. 11 is a schematic view for explaining an erase operation of the same nonvolatile semiconductor memory device.

FIG. 11 is a schematic view for explaining an erase operation of the nonvolatile semiconductor memory device according to the present embodiment. As shown in FIG. 11, in the erase operation, first, a voltage of the bit line BL is set to the bit line voltage Vbl. A voltage of a selected drain side select gate line SGDt connected to a selected memory transistor MTrt that is to undergo the erase operation is set to Verag, and another drain side select gate line SGD is set to a floating state. A voltage of a selected word line WLt connected to the selected memory transistor MTrt is set to a ground voltage Vss, and another word line WL is set to a floating state. A voltage of a selected source side select gate line SGSt connected to the selected memory transistor MTrt is set to Verag, and another source side select gate line SGS is set to a floating state. A voltage of the source line SL is set to the source line voltage Vsl. As a result, electrons are extracted from the charge accumulation layer 443 (FIG. 5) of the selected memory transistor MTrt into the semiconductor layer 441 (FIG. 3) via the tunnel insulating layer 442 (FIG. 5). Now, as shown in FIG. 11, Verag is, for example, about −7 V to −8 V.

[Nonvolatile Semiconductor Memory Device According to Comparative Example]

Figure 12:
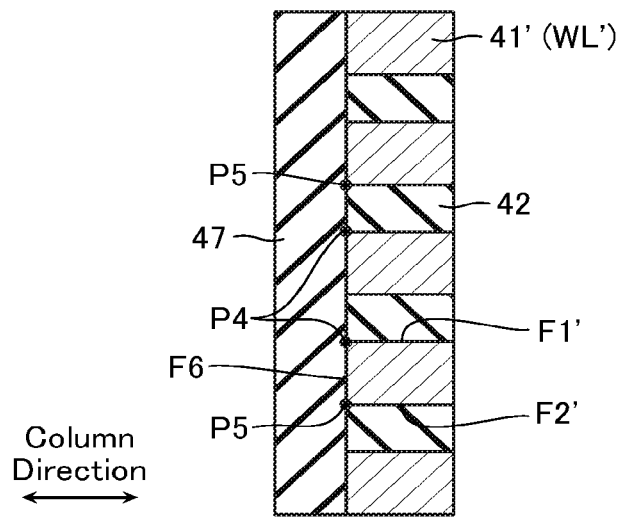
FIG. 12 is a cross-sectional view showing a configuration of part of a nonvolatile semiconductor memory device according to a comparative example.

Next, a configuration of a nonvolatile semiconductor memory device according to a comparative example will be described with reference to FIG. 12. FIG. 12 is a cross-sectional view showing a configuration of part of the nonvolatile semiconductor memory device according to the comparative example.

As shown in FIG. 12, in the nonvolatile semiconductor memory device according to the comparative example, the end in the column direction of a word line WL' in the periphery of the insulating layer 47 is not rounded. That is, an end surface F6 in the column direction of the word line conductive layer 41 is a planar surface. Moreover, the end surface F6 intersects an upper surface F1' of the word line conductive layer 41 at substantially a single point P4. Similarly, the end surface F6 intersects a lower surface F2' of the word line conductive layer 41 at substantially a single point P5.

The end of the word line WL' according to the comparative example is not rounded. Therefore, an electric field easily concentrates in the end of the word line WL' according to the comparative example. Therefore, sometimes, when word lines WL' adjacent in the stacking direction are applied with different voltages, an electric field concentrates between, for example, an upper end P4 of the end surface F6 of a downwardly positioned word line WL' and a lower end P5 of the end surface F6 of an upwardly positioned word line WL', and a leak current ends up flowing.

[Comparison of Nonvolatile Semiconductor Memory Device According to Present Embodiment and Comparative Example]

As shown in FIG. 6, in the present embodiment, the end in the column direction of the word line WL is rounded, hence a distance between fellow tips P1 in the column direction in two of the word lines WL adjacent in the stacking direction, increases. Therefore, it is possible to ease a voltage between, for example, the tip P1 of a downwardly positioned word line WL and the tip P1 of an upwardly positioned word line WL, and suppress occurrence of a leak current.

Moreover, as shown in FIG. 6, in the present embodiment, the tips P1 in the column direction of the word lines WL each have a curvature. Therefore, it is possible to further prevent concentration of an electric field and suppress occurrence of a leak current, compared to in the comparative example.

[Method of Manufacturing]

Next, a method of manufacturing the nonvolatile semiconductor memory device according to the present embodiment will be described with reference to FIGS. 13 to 22. FIGS. 13 to 22 are cross-sectional views for explaining the method of manufacturing the same nonvolatile semiconductor memory device.

Figure 13:
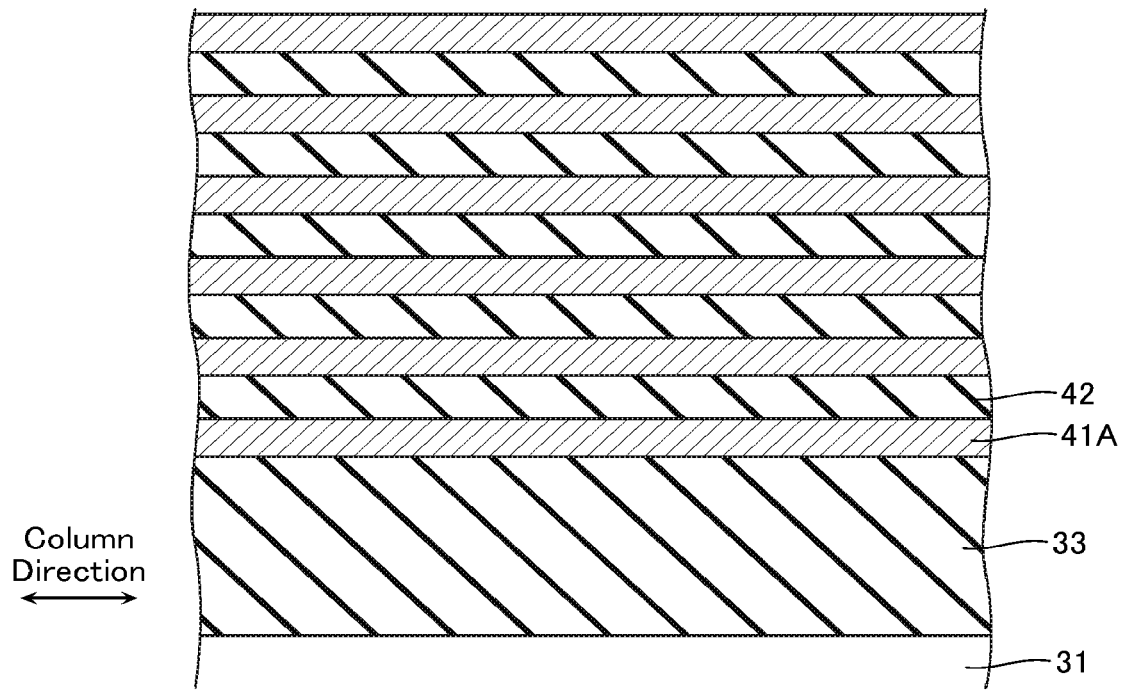
FIG. 13 is a cross-sectional view showing a manufacturing process of the nonvolatile semiconductor memory device according to the first embodiment.

As shown in FIG. 13, the back gate conductive layer 31 and an insulating layer 33 are stacked above a substrate not illustrated, and a plurality of conductive layers 41A which will be the word line conductive layers 41, and inter-layer insulating layers 42 are stacked thereon.

Figure 14:
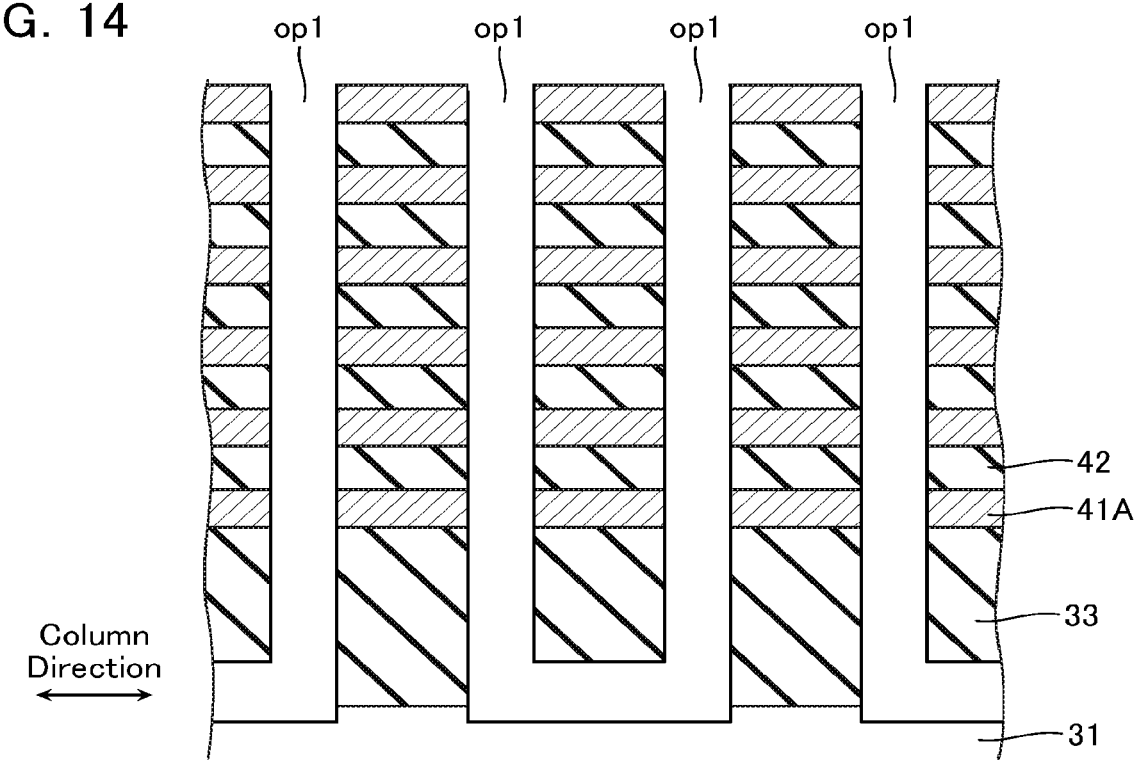
FIG. 14 is a cross-sectional view showing a manufacturing process of the same nonvolatile semiconductor memory device.

Next, as shown in FIG. 14, an opening op1 penetrating each of the layers in the stacking direction is formed on the configuration shown in FIG. 13. The opening op1 will be the memory hole MH shown in FIG. 4. Moreover, as shown in FIG. 14, two adjacent openings op1 are in communication at lower ends thereof.

Figure 15:
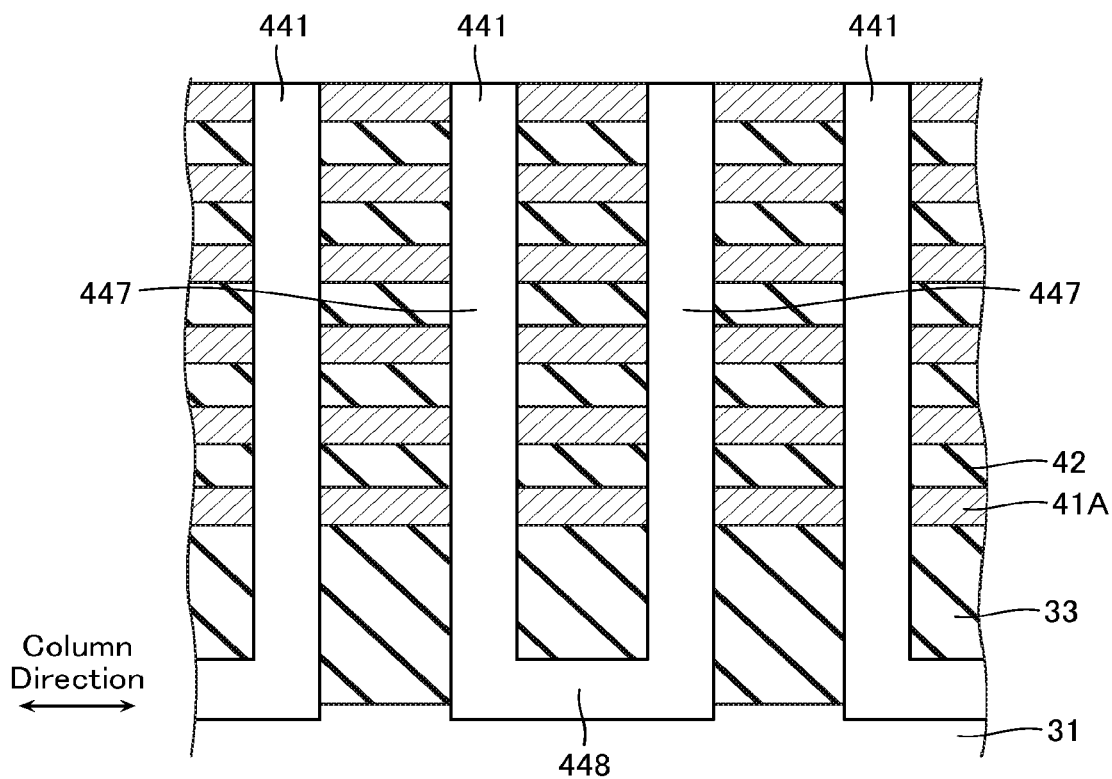
FIG. 15 is a cross-sectional view showing a manufacturing process of the same nonvolatile semiconductor memory device.

Next, as shown in FIG. 15, the memory semiconductor layer 441 is formed in the opening op1. At this time, the tunnel insulating layer 442, the charge accumulation layer 443, and the block insulating layer 444 described with reference to FIG. are also formed, although this is not illustrated in FIG. 15. As a result, the inside of the opening op1 is filled.

Figure 16:
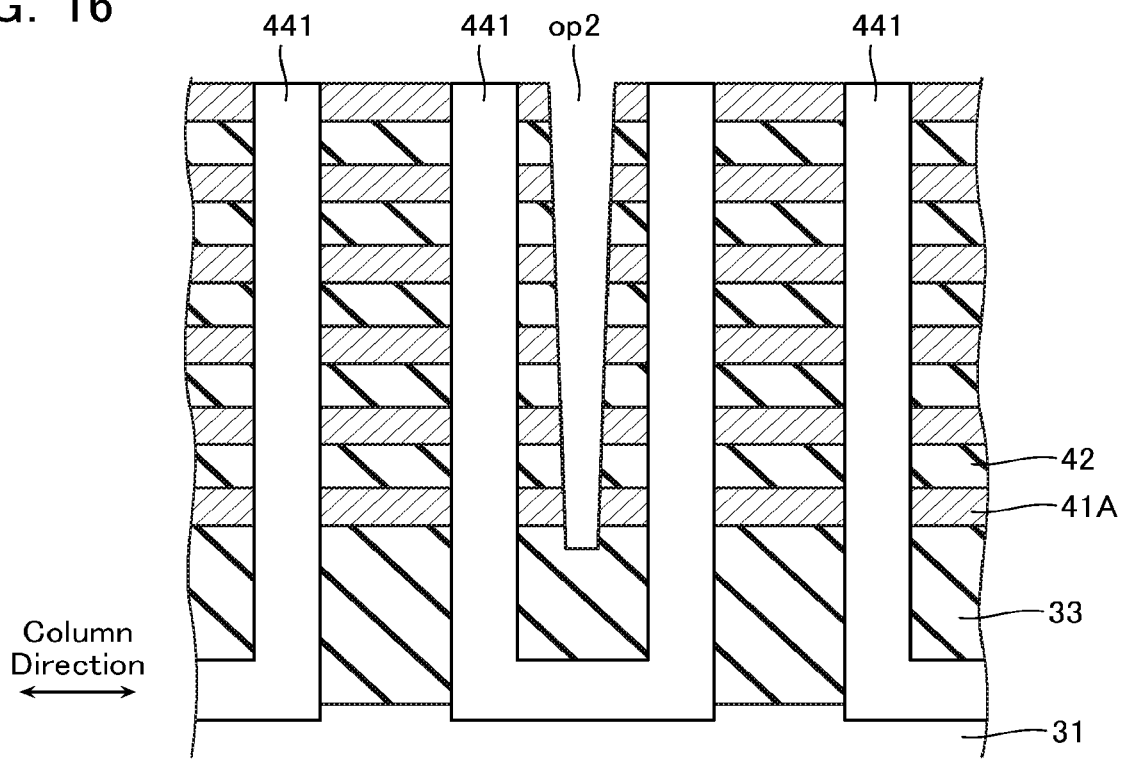
FIG. 16 is a cross-sectional view showing a manufacturing process of the same nonvolatile semiconductor memory device.

Next, as shown in FIG. 16, the stacked plurality of conductive layers 41A and inter-layer insulating layers 42 are divided in the column direction. A slit (trench) dividing these layers is referred to below as an opening op2. The opening op2 is formed between the pair of columnar portions 447 whose lower ends are coupled by the coupling portion 448, and divides in the column direction the conductive layer 41A positioned in a periphery of one of the columnar portions 447 and the conductive layer 41A positioned in a periphery of the other of the columnar portions 447. Note that formation of the opening op2 is performed by, for example, a means such as RIE (Reactive Ion Etching), or the like.

Figure 17:
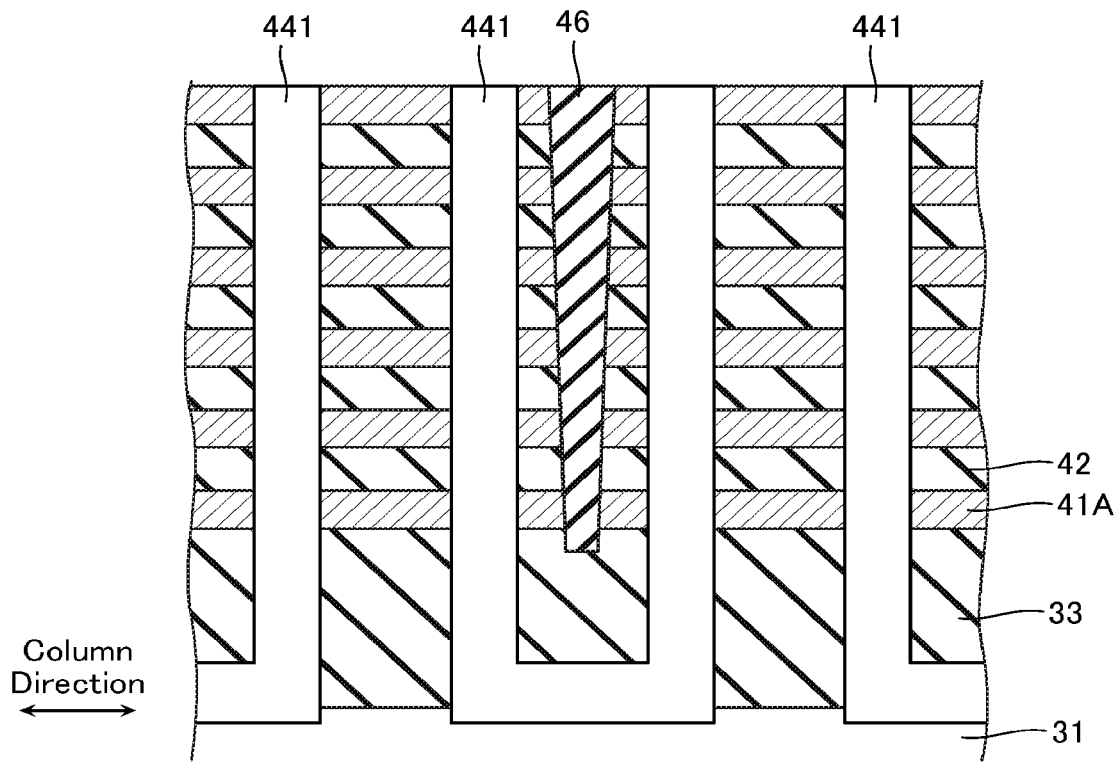
FIG. 17 is a cross-sectional view showing a manufacturing process of the same nonvolatile semiconductor memory device.

Next, as shown in FIG. 17, the insulating layer 46 is filled into the opening op2.

Figure 18:
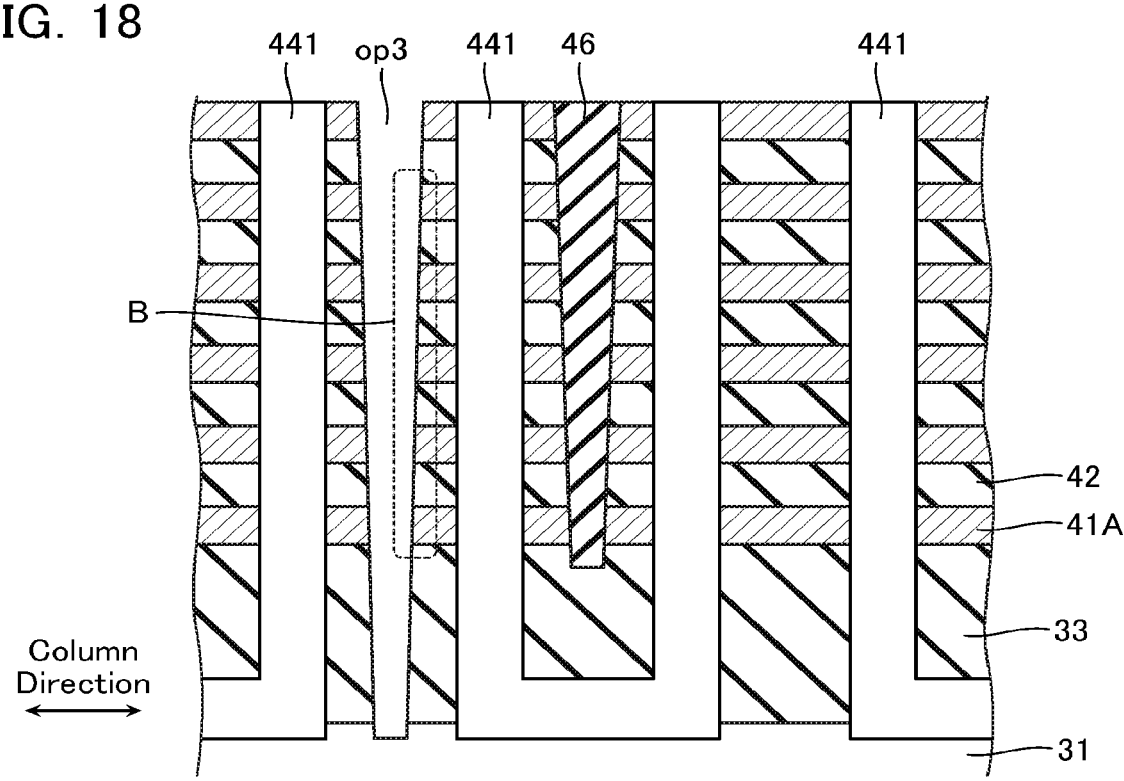
FIG. 18 is a cross-sectional view showing a manufacturing process of the same nonvolatile semiconductor memory device.
Figure 19:
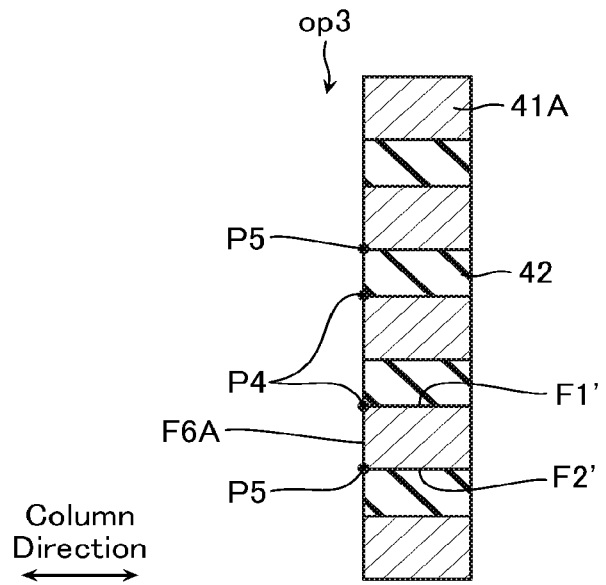
FIG. 19 is a cross-sectional view showing a manufacturing process of the same nonvolatile semiconductor memory device.

Next, as shown in FIGS. 18 and 19, the stacked plurality of conductive layers 41A and inter-layer insulating layers 42, and the insulating layer 33 are divided in the column direction. A slit (trench) dividing these layers is referred to below as an opening op3. The opening op3 divides in the column direction the conductive layers 41A which will be the word line conductive layers 41 configuring different memory blocks MB. Note that formation of the opening op3 is performed by, for example, a means such as RIE, or the like.

At this time, as shown in FIG. 19, an end surface F6A exposed in the opening op3 of the conductive layer 41A is flat. Moreover, the end surface F6A intersects an upper surface F1' of the conductive layer 41A at substantially a single point P4. Similarly, the end surface F6A intersects a lower surface F2' of the conductive layer 41A at substantially a single point P5.

Figure 20:
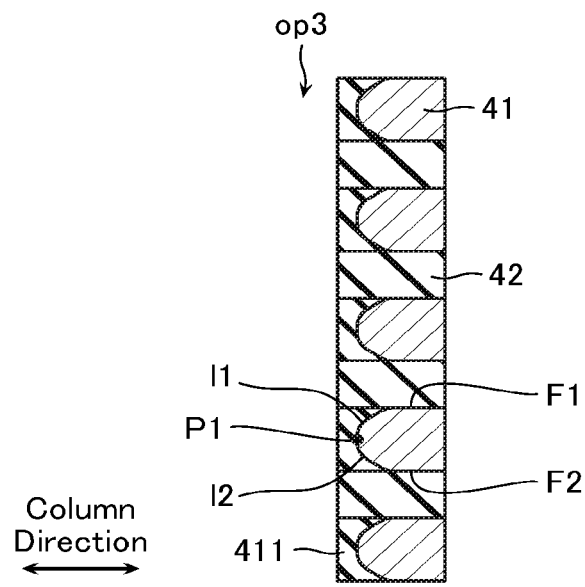
FIG. 20 is a cross-sectional view showing a manufacturing process of the same nonvolatile semiconductor memory device.

Next, as shown in FIG. 20, an oxidation treatment is performed. As a result, as shown in FIG. 20, the end exposed in the opening op3 of the conductive layer 41A is oxidized to become the oxide portion 411. Oxidation of an end of the conductive layer 41A proceeds comparatively quickly in a portion close to the opening op3 and close to the upper surface F1' and the lower surface F2', of the conductive layer 41A. Therefore, as shown in FIG. 20, the word line conductive layer 41 is rounded by the oxidation treatment. That is, the curve 11 joining the tip P1 in the column direction of the word line conductive layer 41 and the upper surface F1 of the word line conductive layer 41 becomes an upwardly convex curve. Similarly, the curve 12 joining the tip P1 in the column direction of the word line conductive layer 41 and the lower surface F2 of the word line conductive layer 41 becomes a downwardly convex curve. Note that in the present embodiment, the curves 11 and 12 have a width of 1 nm or more in the stacking direction. Moreover, in the present embodiment, the curves 11 and 12 have a curvature, and a radius of curvature of these curves 11 and 12 is 20 nm or more.

Note that the oxidation treatment is performed by, for example, a method employing plasma such as SPA (Slot Plane Antenna) plasma oxidation, and so on, or a method such as wet oxidation using water vapor, dry oxidation using an oxygen based gas, RTO (Rapid Thermal Oxidation), radical oxidation, and so on.

Figure 21:
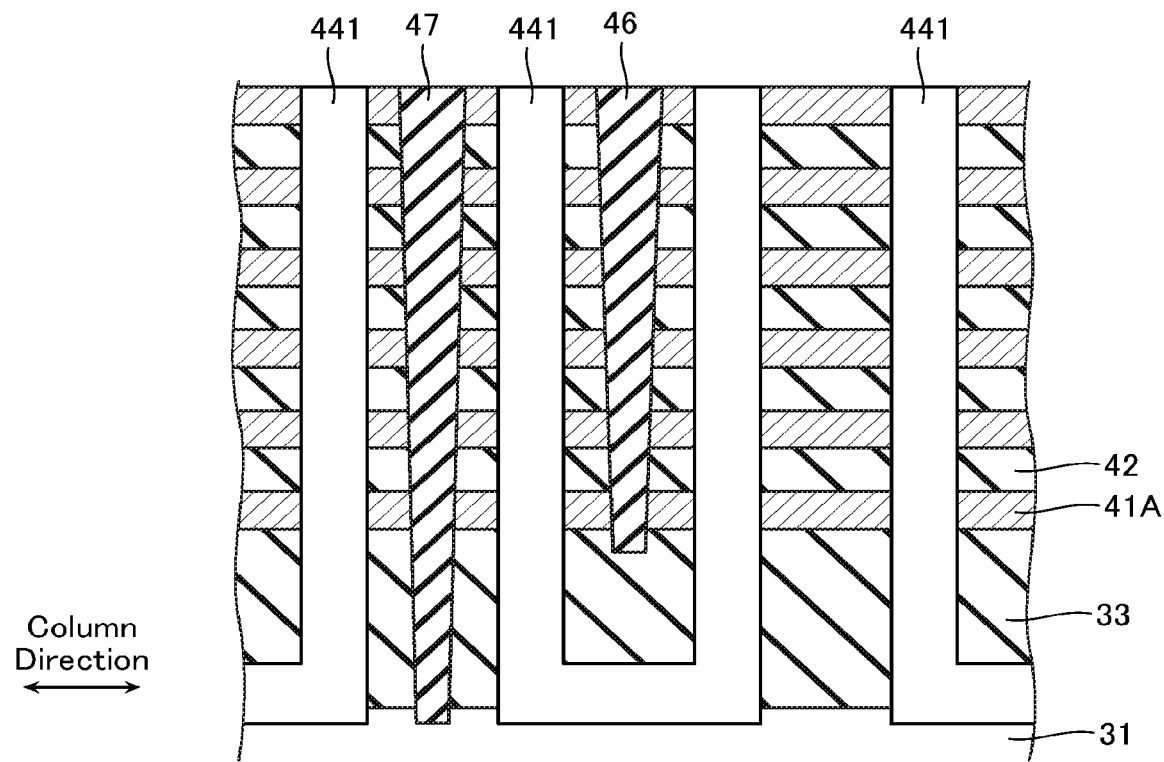
FIG. 21 is a cross-sectional view showing a manufacturing process of the same nonvolatile semiconductor memory device.
Figure 22:
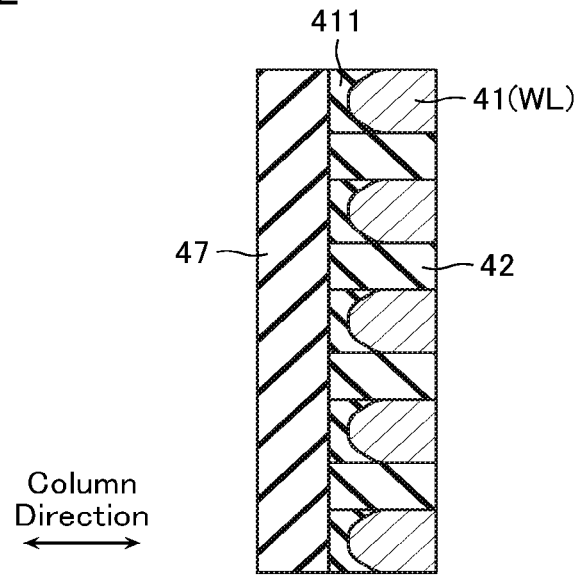
FIG. 22 is a cross-sectional view showing a manufacturing process of the same nonvolatile semiconductor memory device.

Next, as shown in FIGS. 21 and 22, the insulating layer 47 is filled into the opening op3.

Subsequently, the likes of the select transistor layer and the wiring line layer 60 described with reference to FIGS. 3 and 4 are formed, whereby the nonvolatile semiconductor memory device according to the present embodiment can be manufactured.

Second Embodiment

Figure 23:
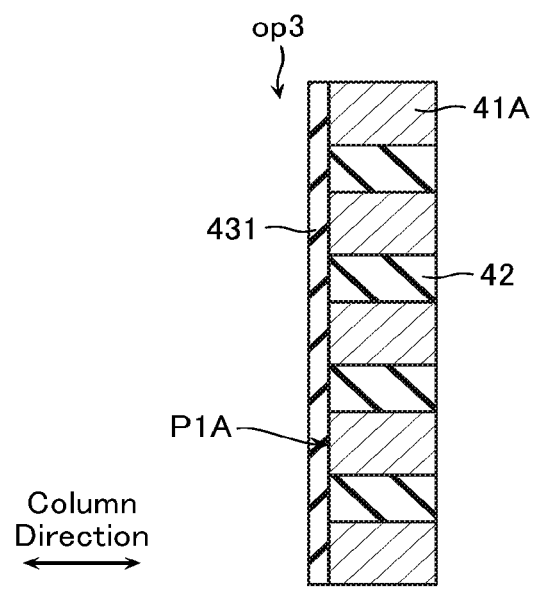
FIG. 23 is a cross-sectional view showing a manufacturing process of a nonvolatile semiconductor memory device according to a second embodiment.
Figure 24:
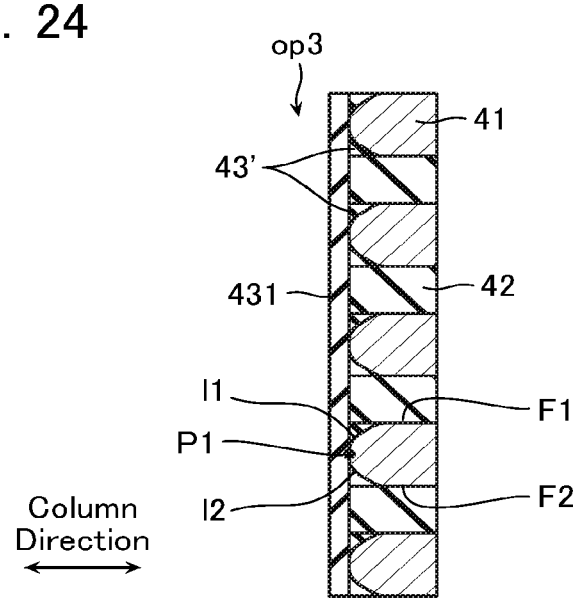
FIG. 24 is a cross-sectional view showing a manufacturing process of the same nonvolatile semiconductor memory device.

Next, a method of manufacturing a nonvolatile semiconductor memory device according to a second embodiment will be described with reference to FIGS. 23 and 24. FIGS. 23 and 24 are cross-sectional views showing the same method of manufacturing. Note that in the description below, portions similar to those in the first embodiment are assigned with reference symbols similar to those assigned in the first embodiment, and descriptions of said portions will be omitted.

The nonvolatile semiconductor memory device according to the present embodiment is basically configured similarly to the nonvolatile semiconductor memory device according to the first embodiment, but some of the manufacturing processes thereof are different. Moreover, the method of manufacturing the nonvolatile semiconductor memory device according to the present embodiment is performed similarly to the method of manufacturing according to the first embodiment up to the processes described with reference to FIGS. 18 and 19.

As shown in FIG. 23, in the present embodiment, an insulating layer 431 is formed inside the opening op3. The insulating layer 431 covers the end PIA of the plurality of conductive layers 41A exposed in the opening op3, and has a film thickness of a degree not filling in all of the inside of the opening op3.

Next, as shown in FIG. 24, an oxidation treatment is performed. As a result, as shown in FIG. 24, part of the end PIA of the conductive layer 41A is oxidized to become an oxide portion 43'. Moreover, similarly to in the first embodiment, the end of the word line conductive layer 41 is rounded by the oxidation treatment. Note that the oxidation treatment can be performed by, for example, the variety of methods described with reference to FIG. 20.

Subsequently, the insulating layer 47 is filled into the opening op3, and the likes of the select transistor layer 50 and the wiring line layer 60 described with reference to FIGS. 3 and 4 are formed, whereby the nonvolatile semiconductor memory device according to the present embodiment can be manufactured.

Third Embodiment

Figure 25:
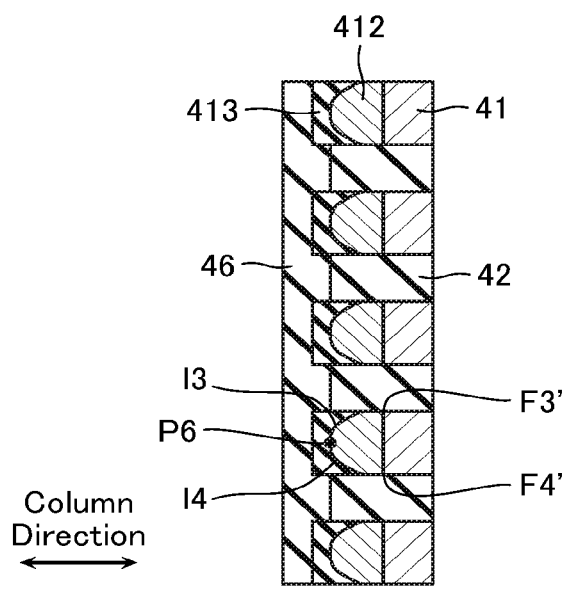
FIG. 25 is a schematic cross-sectional view showing a configuration of part of a nonvolatile semiconductor memory device according to a third embodiment.

Next, a nonvolatile semiconductor memory device according to a third embodiment will be described with reference to FIG. 25. FIG. 25 is a schematic cross-sectional view showing a configuration of part of the nonvolatile semiconductor memory device according to the third embodiment. Note that in the description below, portions similar to those in the first embodiment are assigned with reference symbols similar to those assigned in the first embodiment, and descriptions of said portions will be omitted.

The nonvolatile semiconductor memory device according to the present embodiment is basically configured similarly to the nonvolatile semiconductor memory device according to the first embodiment, but a mode of the end in the column direction of the word line conductive layer 41 in the periphery of the insulating layer 46 is different. That is, as shown in FIG. 7, in the first embodiment, the end in the column direction of the word line conductive layer 41 in the periphery of the insulating layer 46 was not rounded.

In contrast, in the present embodiment, as shown in FIG. the end in the column direction of the word line conductive layer 41 in the periphery of the insulating layer 46 is configured as a silicide portion 412. An end in the column direction of the silicide portion 412 is rounded. That is, a curve 13 joining a tip P6 in the column direction of the silicide portion 412 and an upper surface F3' of the word line conductive layer 41 is an upwardly convex curve. Similarly, a curve 14 joining the tip P6 in the column direction of the silicide portion 412 and a lower surface F4' of the word line conductive layer 41 is a downwardly convex curve. The curves 13 and 14 have a width of 1 nm or more in the stacking direction. Moreover, in the present embodiment, the curves 13 and 14 have a curvature, and a radius of curvature of these curves 13 and 14 is 20 nm or more. Note that the curves 13 and 14 may be curves approximated to a cross-sectional image of the word line conductive layer 41.

Note that the silicide portion 412 is conceivably configured from, for example, a silicide including Sc, Ti, V, Cr, Mn, Fe, Co, Ni, Cu, Zn, Rh, Pd, Ag, Cd, In, Sn, La, Hf, Ta, W, Re, Os, Ir, Pt, or Au. In addition, the silicide portion 412 may be configured from, for example, such a silicide having added thereto one element or two or more elements selected from Sc, Ti, V, Cr, Mn, Fe, Co, Ni, Cu, Y, Zr, Nb, Mo, Tc, Ru, Rh, Pd, Ag, Cd, In, Sn, La, Hf, Ta, W, Re, Os, Ir, Pt, or Au.

Moreover, as shown in FIG. 25, an oxide-silicide portion 413 contacting the silicide portion 412 is formed between the silicide portion 412 and the insulating layer 46. The oxide-silicide portion 413 protrudes further to an insulating layer 46 side, compared to the inter-layer insulating layer 42. Note that the oxide-silicide portion 413 is configured from, for example, a material having insulation properties and obtained by oxidizing a material configuring the silicide portion 412.

Figure 26:
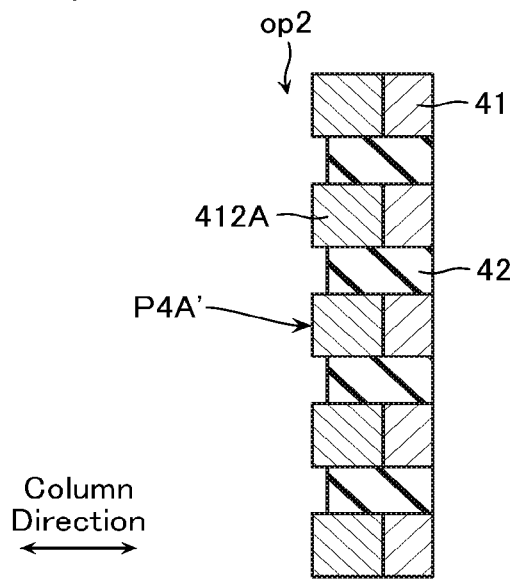
FIG. 26 is a cross-sectional view showing a manufacturing process of the same nonvolatile semiconductor memory device.
Figure 27:
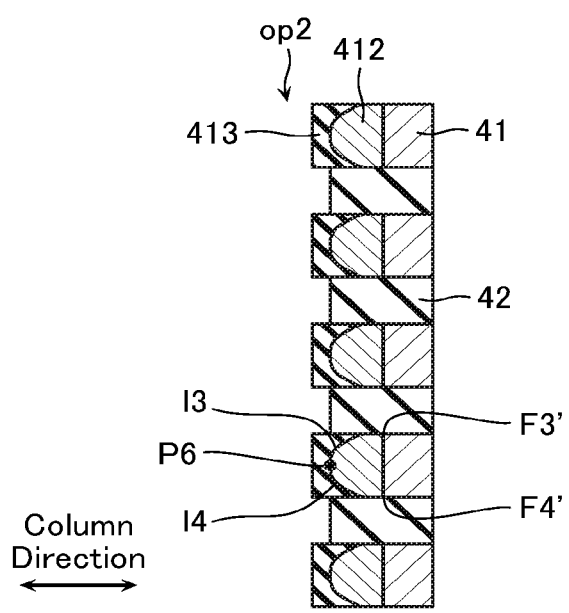
FIG. 27 is a cross-sectional view showing a manufacturing process of the same nonvolatile semiconductor memory device.

Next, a method of manufacturing the nonvolatile semiconductor memory device according to the present embodiment will be described with reference to FIGS. 26 and 27. FIGS. 26 and 27 are cross-sectional views for explaining the method of manufacturing the nonvolatile semiconductor memory device according to the present embodiment.

The method of manufacturing the nonvolatile semiconductor memory device according to the present embodiment is performed similarly to the method of manufacturing according to the first embodiment up to the process described with reference to FIG. 16.

As shown in FIG. 26, in the present embodiment, an end P4A' of the plurality of conductive layers 41A exposed in the opening op2 is silicided to form a silicide portion 412A. The silicide portion 412A protrudes further in a direction toward the inside of the opening op2, compared to the inter-layer insulating layer 42.

Next, as shown in FIG. 27, an oxidation treatment is performed. As a result, as shown in FIG. 27, part of the silicide portion 412A is oxidized to become the oxide-silicide portion 413. Moreover, the end of the silicide portion 412 is rounded by the oxidation treatment. That is, the curve 13 joining the tip P6 in the column direction of the silicide portion 412 and the upper surface F3' of the word line conductive layer 41 becomes an upwardly convex curve. Similarly, the curve 14 joining the tip P6 in the column direction of the silicide portion 412 and the lower surface F4' of the word line conductive layer 41 becomes a downwardly convex curve. The curves 13 and 14 have a width of 1 nm or more in the stacking direction. Moreover, in the present embodiment, the curves 13 and 14 have a curvature, and a radius of curvature of these curves 13 and 14 is 20 nm or more. Note that the oxidation treatment can be performed by, for example, the variety of methods described with reference to FIG. 20.

Subsequently, each of the processes described with reference to FIGS. 17 to 22 is performed, and, furthermore, the likes of the select transistor layer 50 and the wiring line layer described with reference to FIGS. 3 and 4 are formed, whereby the nonvolatile semiconductor memory device according to the present embodiment can be manufactured.

Fourth Embodiment

Figure 28:
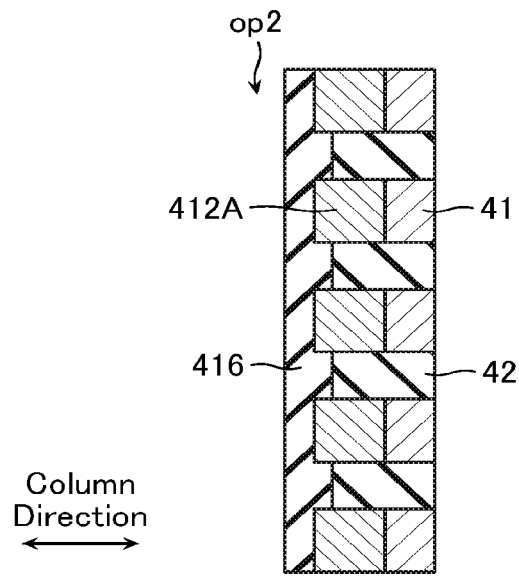
FIG. 28 is a cross-sectional view showing a manufacturing process of a nonvolatile semiconductor memory device according to a fourth embodiment.
Figure 29:
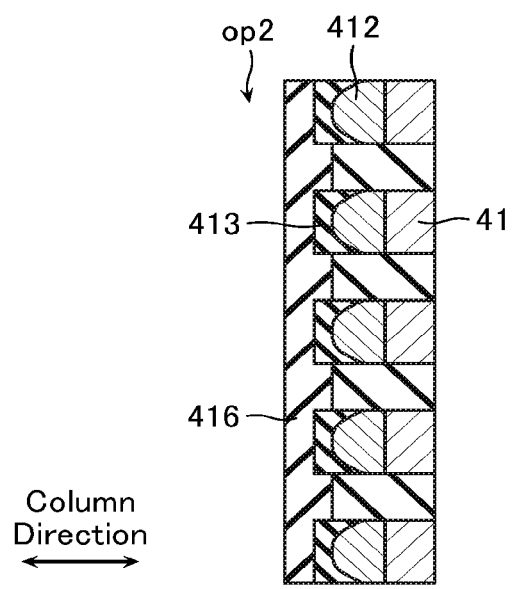
FIG. 29 is a cross-sectional view showing a manufacturing process of the same nonvolatile semiconductor memory device.

Next, a method of manufacturing a nonvolatile semiconductor memory device according to a fourth embodiment will be described with reference to FIGS. 28 and 29. FIGS. 28 and 29 are cross-sectional views showing the same method of manufacturing. Note that in the description below, portions similar to those in the third embodiment are assigned with reference symbols similar to those assigned in the third embodiment, and descriptions of said portions will be omitted.

The nonvolatile semiconductor memory device according to the present embodiment is basically configured similarly to the nonvolatile semiconductor memory device according to the third embodiment, but some of the manufacturing processes thereof are different. The method of manufacturing the nonvolatile semiconductor memory device according to the present embodiment is performed similarly to the method of manufacturing according to the third embodiment up to the process described with reference to FIG. 26.

As shown in FIG. 28, in the present embodiment, an insulating layer 416 is formed inside the opening op2. The insulating layer 416 covers the end of the plurality of silicide portions 412A exposed in the opening op2, and has a film thickness of a degree not filling in all of the inside of the opening op2.

Next, as shown in FIG. 29, an oxidation treatment is performed. As a result, as shown in FIG. 29, part of the end of the silicide portion 412A is oxidized to become the oxide-silicide portion 413. Moreover, the end of the silicide portion 412 is rounded by the oxidation treatment. Note that the oxidation treatment can be performed by, for example, the variety of methods described with reference to FIG. 20.

Subsequently, each of the processes described with reference to FIGS. 17 to 22 is performed, and, furthermore, the likes of the select transistor layer 50 and the wiring line layer described with reference to FIGS. 3 and 4 are formed, whereby the nonvolatile semiconductor memory device according to the present embodiment can be manufactured.

Fifth Embodiment

Figure 30:
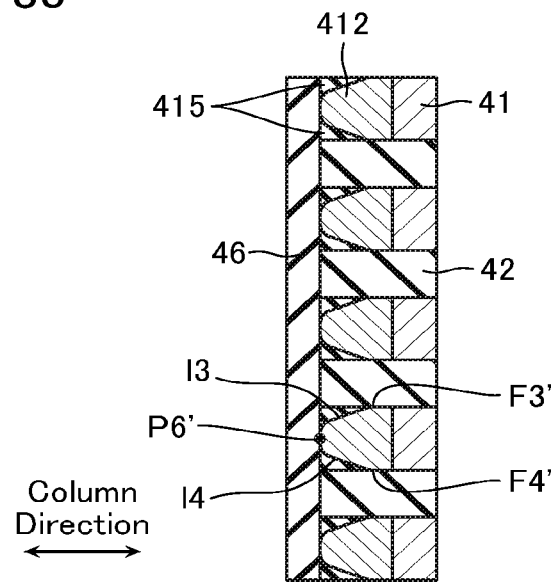
FIG. 30 is a schematic cross-sectional view showing a configuration of part of a nonvolatile semiconductor memory device according to a fifth embodiment.

Next, a nonvolatile semiconductor memory device according to a fifth embodiment will be described with reference to FIG. 30. FIG. 30 is a schematic cross-sectional view showing a configuration of part of the nonvolatile semiconductor memory device according to the fifth embodiment. Note that in the description below, portions similar to those in the third embodiment are assigned with reference symbols similar to those assigned in the third embodiment, and descriptions of said portions will be omitted.

The nonvolatile semiconductor memory device according to the present embodiment is basically configured similarly to the nonvolatile semiconductor memory device according to the third embodiment, but as shown in FIG. 30, in the present embodiment, the silicide portion 412 contacts the insulating layer 46 at a tip P6' in the column direction. Moreover, a curved portion joining the tip P6' and the upper surface F3' of the word line conductive layer 41 contacts an oxide portion 415. Similarly, a curved portion joining the tip P6' and the lower surface F4' of the word line conductive layer 41 contacts the oxide portion 415.

Figure 31:
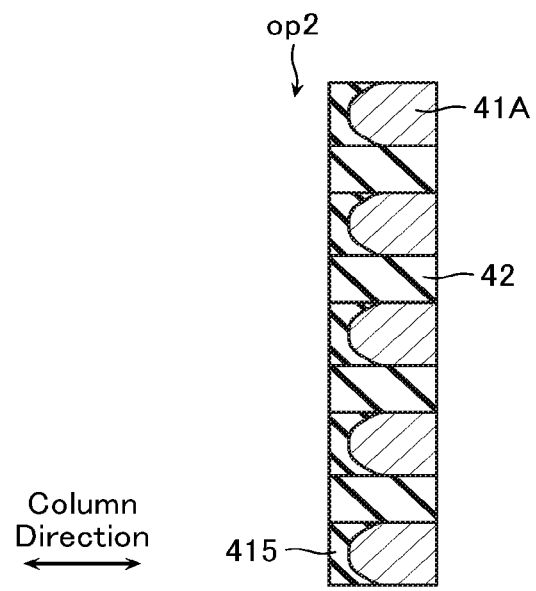
FIG. 31 is a cross-sectional view showing a manufacturing process of the same nonvolatile semiconductor memory device.
Figure 32:
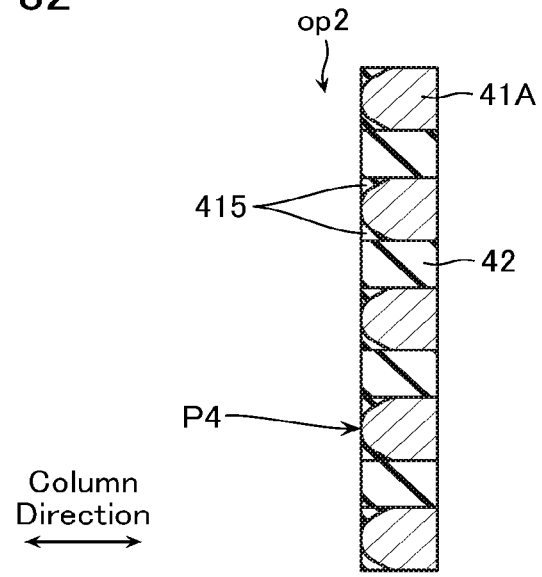
FIG. 32 is a cross-sectional view showing a manufacturing process of the same nonvolatile semiconductor memory device.
Figure 33:
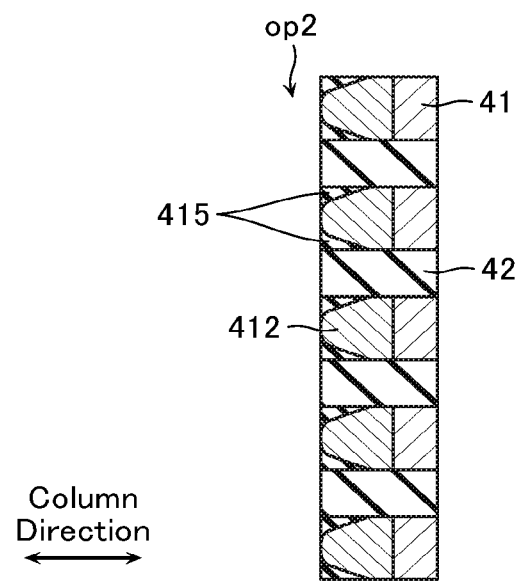
FIG. 33 is a cross-sectional view showing a manufacturing process of the same nonvolatile semiconductor memory device.

Next, a method of manufacturing the nonvolatile semiconductor memory device according to the present embodiment will be described with reference to FIGS. 31 to 33. FIGS. 31 to 33 are cross-sectional views for explaining the method of manufacturing the nonvolatile semiconductor memory device according to the present embodiment.

The method of manufacturing the nonvolatile semiconductor memory device according to the present embodiment is performed similarly to the method of manufacturing according to the first embodiment up to the process described with reference to FIG. 16.

As shown in FIG. 31, in the present embodiment, an oxidation treatment is performed. As a result, as shown in FIG. 31, part of the end exposed in the opening op2 of the conductive layer 41A is oxidized to become the oxide portion 415. Oxidation of the end of the conductive layer 41A proceeds comparatively quickly in a portion close to the opening op2 and close to the upper surface and the lower surface, of the conductive layer 41A. Therefore, as shown in FIG. 31, the end of the conductive layer 41A is rounded by the oxidation treatment. Note that the oxidation treatment can be performed by, for example, the variety of methods described with reference to FIG.

Next, as shown in FIG. 32, part of the inter-layer insulating layer 42 and the oxide portion 415 is removed via the opening op2, and the conductive layer 41A is exposed in the opening op2.

Next, as shown in FIG. 33, a tip P4 of the plurality of conductive layers 41A exposed in the opening op2 is silicided to form the silicide portion 412.

Subsequently, each of the processes described with reference to FIGS. 17 to 22 is performed, and, furthermore, the likes of the select transistor layer 50 and the wiring line layer described with reference to FIGS. 3 and 4 are formed, whereby the nonvolatile semiconductor memory device according to the present embodiment can be manufactured.

Sixth Embodiment

Configuration

Figure 34:
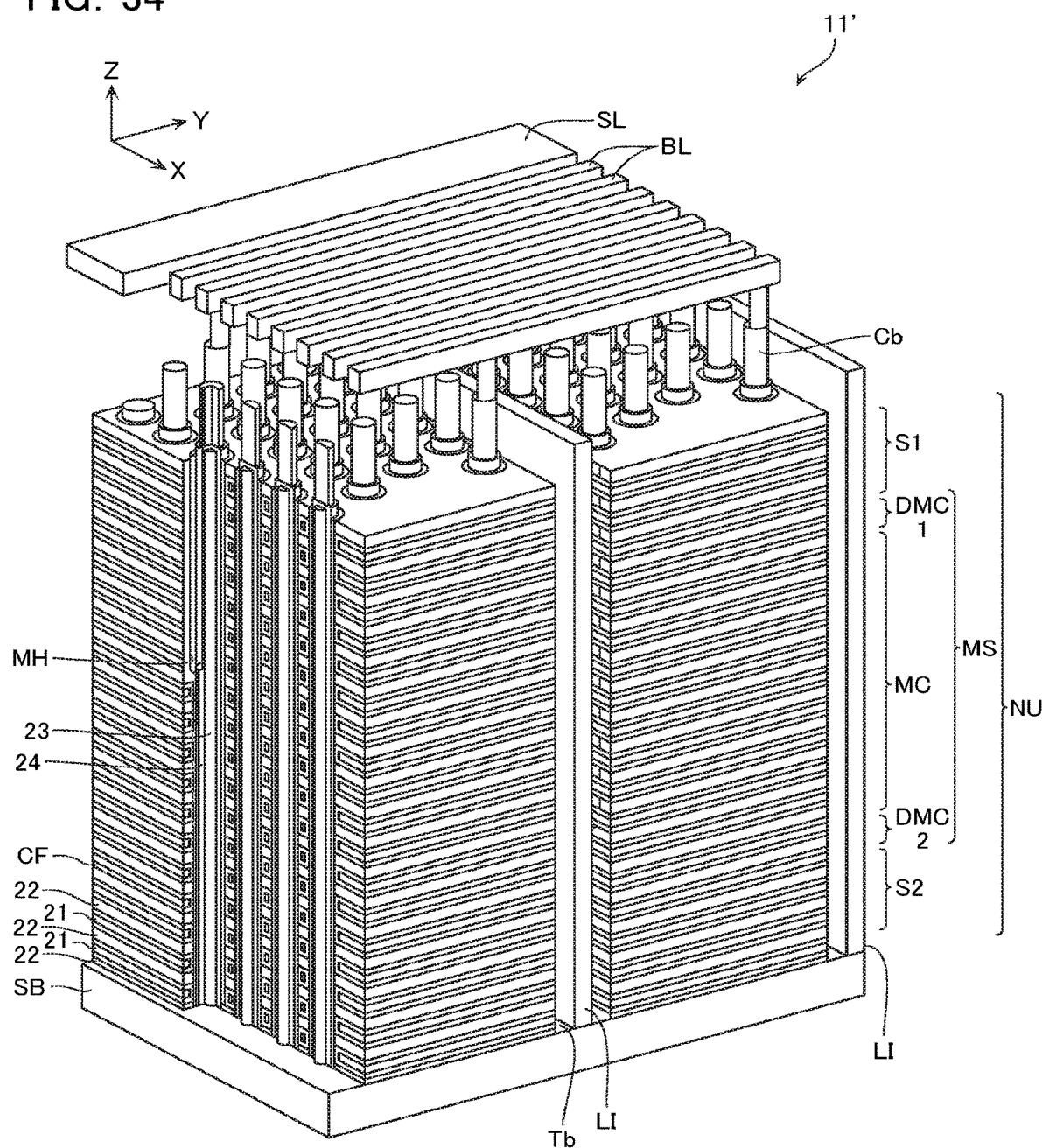
FIG. 34 is a schematic perspective view showing a configuration of part of a nonvolatile semiconductor memory device according to a sixth embodiment.
Figure 35:
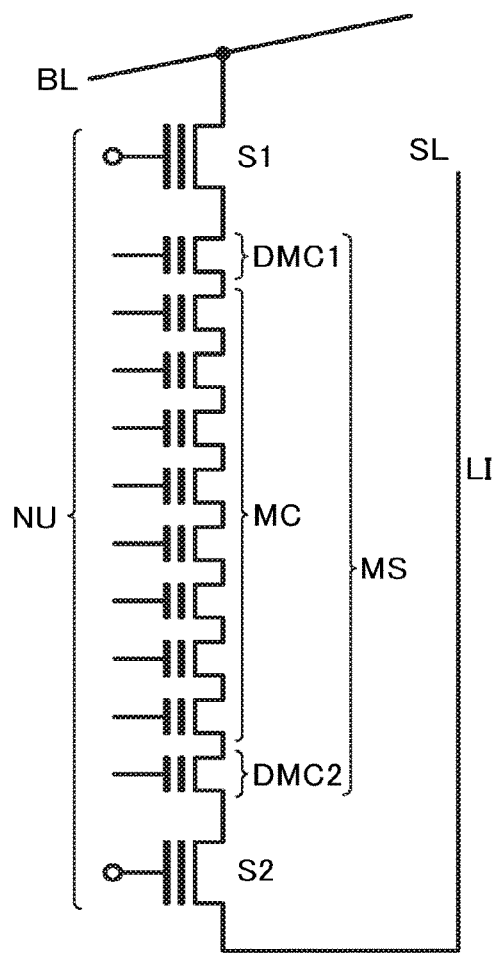
FIG. 35 is a circuit diagram showing a configuration of part of the same nonvolatile semiconductor memory device.
Figure 36:
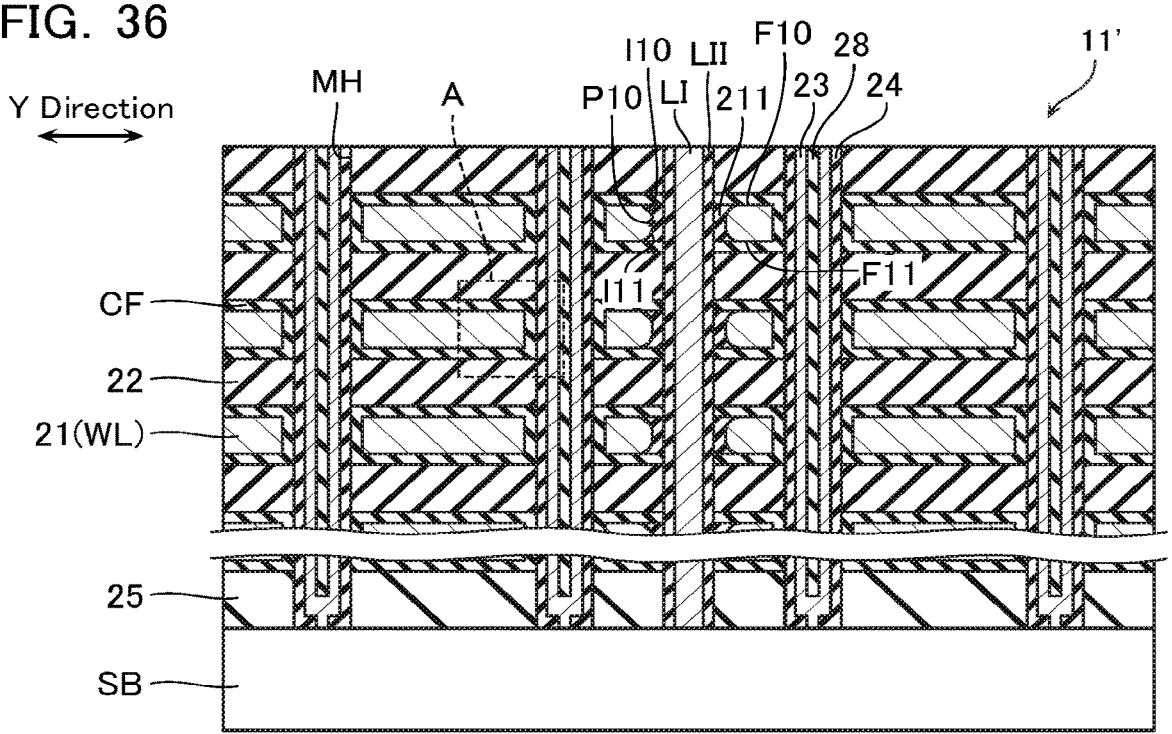
FIG. 36 is a schematic cross-sectional view showing a configuration of part of the same nonvolatile semiconductor memory device.

Next, a nonvolatile semiconductor memory device according to a sixth embodiment will be described with reference to FIGS. 34 to 36. FIG. 34 is a perspective view showing a structure of part of a memory cell array 11' according to the present embodiment; FIG. 35 is an equivalent circuit diagram of one NAND cell unit NU; and FIG. 36 is a cross-sectional view of the memory cell array 11'.

In the first through fifth embodiments, as described with reference to, for example, FIGS. 3 and 4, the memory semiconductor layer 441 includes the pair of columnar portions 447 extending in the direction perpendicular to the substrate 20 and the coupling portion 448 coupling the pair of columnar portions 447 at lower ends thereof, and is formed in a U shape as viewed from the row direction. In contrast, as shown in FIGS. 34 to 36, the present embodiment adopts a configuration of a kind in which the semiconductor layers 441 are not coupled at lower ends thereof.

As shown in FIG. 34, the memory cell array 11' according to the present embodiment has a structure in which inter-layer insulating layers 22 and conductive layers 21 are stacked alternately on a semiconductor substrate SB. This conductive layer 21 functions as a control gate of a memory cell MC (word line WL), as a source side select gate line SGS, and as a drain side select gate line SGD. The inter-layer insulating layer 22 is disposed above and below these conductive layers 21, and electrically insulates fellow conductive layers 21.

The conductive layer 21 may be formed by, for example, tungsten (W), tungsten nitride (WN), tungsten silicide (WSix), tantalum (Ta), tantalum nitride (TaN), tantalum silicide (TaSix), palladium silicide (PdSix), erbium silicide (ErSix), yttrium silicide (YSix), platinum silicide (PtSix), hafnium silicide (HfSix), nickel silicide (NiSix), cobalt silicide (CoSix), titanium silicide (TiSix), vanadium silicide (VSix), chromium silicide (CrSix), manganese silicide (MnSix), iron silicide (FeSix), ruthenium (Ru), molybdenum (Mo), titanium (Ti), titanium nitride (TiN), vanadium (V), chromium (Cr), manganese (Mn), iron (Fe), cobalt (Co), nickel (Ni), gold (Au), silver (Ag), or copper (Cu), or a compound thereof, but may be formed by polysilicon to which an impurity has been added.

As shown in FIG. 36, a stacking film CF is formed in a periphery of the conductive layer 21. The stacking film CF is configured from a block high dielectric layer and a barrier metal.

Moreover, as shown in FIG. 36, the conductive layer 21 is divided in the Y direction via a later-described source contact LI. Furthermore, an end in a Y direction of the conductive layer 21 (an end facing the source contact LI) is rounded. That is, a curve 110 joining a tip P10 in the Y direction of the conductive layer 21 and an upper surface F10 of the conductive layer 21 is an upwardly convex curve. Similarly, a curve 111 joining the tip P10 in the Y direction of the conductive layer 21 and a lower surface F11 of the conductive layer 21 is a downwardly convex curve. The curves 110 and 111 have a width of 1 nm or more in a stacking direction. Moreover, in the present embodiment, the curves 110 and 111 have a curvature, and a radius of curvature of these curves 110 and 111 is 20 nm or more. Note that the curves 110 and 111 may be curves approximated to a cross-sectional image of the conductive layer 21.

In addition, as shown in FIG. 36, an oxide portion 211 contacting the tip P10 in the Y direction of the conductive layer 21 is formed between the conductive layer 21 and a later-described inter-layer insulating layer LII.

Moreover, as shown in FIG. 36, a memory hole MH is formed in such an inter-layer insulating layer 22 and conductive layer 21 so as to penetrate a stacked body of the inter-layer insulating layer 22 and conductive layer 21. The memory holes MH are arranged with a certain pitch in an XY plane. Moreover, formed in the memory hole MH, sequentially from a center thereof, are a core insulating layer 28, a semiconductor layer 23, and a memory layer 24 that have the stacking direction (a Z direction) as a longitudinal direction. As will be mentioned later, the semiconductor layer 23 is configured from the likes of polysilicon. The memory layer 24 may be formed from a stacked structure of a charge accumulation layer of the likes of a silicon nitride layer, and an oxide layer of the likes of a silicon oxide layer. A threshold voltage of the memory cell MC changes by an accumulated amount of charge to this charge accumulation layer, and the memory cell MC stores data corresponding to this threshold voltage.

The semiconductor layer 23 is connected to a bit line BL via a contact Cb at an upper end of the semiconductor layer 23. The bit lines BL are arranged with a certain pitch in an X direction, and have the Y direction as a longitudinal direction.

Moreover, a lower end of the semiconductor layer 23 is connected to the semiconductor substrate SB. The lower end of the semiconductor layer 23 is connected to a source line SL via this semiconductor substrate SB and the source contact LI. The source lines SL are arranged having the Y direction as a longitudinal direction, similarly to the bit lines BL.

Note that the stacked body of the inter-layer insulating layer 22 and conductive layer 21 in the memory cell array 11' is divided on a block basis, the block being a minimum unit of data erase. A trench Tb is formed at a boundary of division, and this trench Tb has the inter-layer insulating layer LII (FIG. 34) implanted therein, and has the previously-mentioned source contact LI further formed therein penetrating the inter-layer insulating layer LII. This source contact LI has its lower end connected to the semiconductor substrate SB and its upper end connected to the source line SL.

FIG. 35 is an equivalent circuit diagram of one NAND cell unit NU. In this memory cell array 11', one NAND cell unit NU comprises: a memory string MS configured from a plurality of the memory cells MC, a dummy cell DMC1, and a dummy cell DMC2; a drain side select transistor Si connected between an upper end of the memory string MS and the bit line BL; and a source side select transistor S2 connected between a lower end of the memory string MS and the source line SL.

[Method of Manufacturing]

Next, a method of manufacturing the nonvolatile semiconductor memory device according to the sixth embodiment will be described with reference to FIGS. 37 to 44. FIGS. 37 to 44 are cross-sectional views for explaining the method of manufacturing according to the sixth embodiment.

Figure 37:
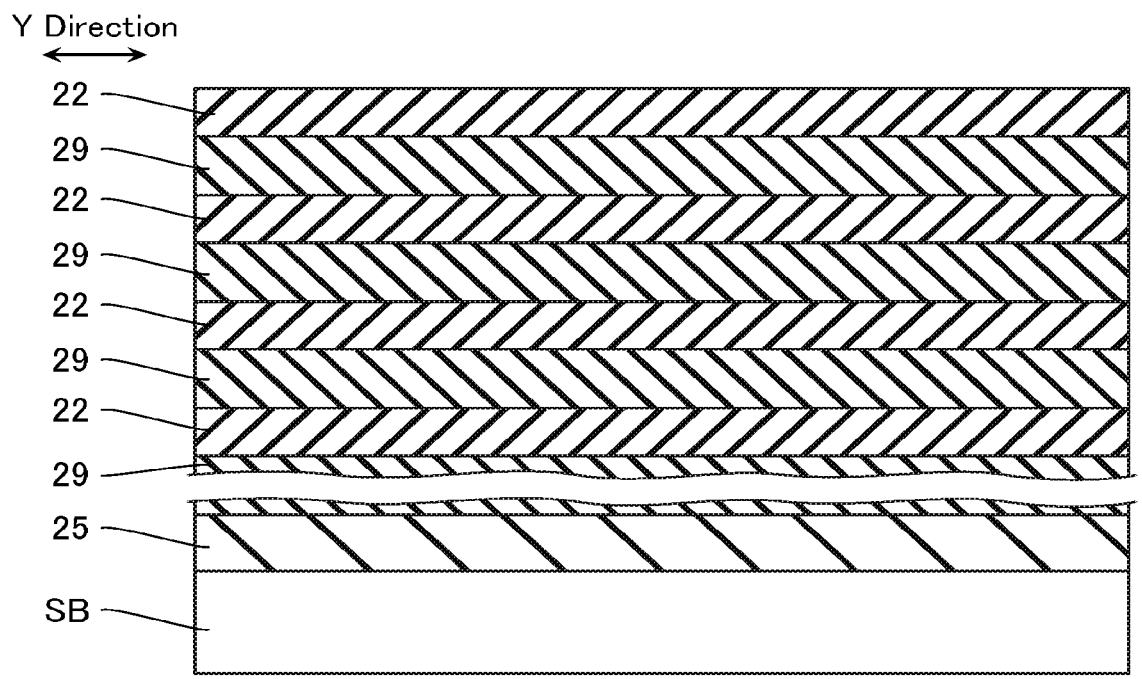
FIG. 37 is a cross-sectional view showing a manufacturing process of the same nonvolatile semiconductor memory device.

As shown in FIG. 37, an insulating layer 25 is stacked on the semiconductor substrate SB. In addition, a plurality of sacrifice layers 29 and the inter-layer insulating layers 22 are stacked alternately on the insulating layer 25. Note that the insulating layer 25 and the inter-layer insulating layer 22 are formed from, for example, silicon oxide ($SiO_2$). Moreover, the sacrifice layer 29 is formed from, for example, silicon nitride (SiN).

Figure 38:
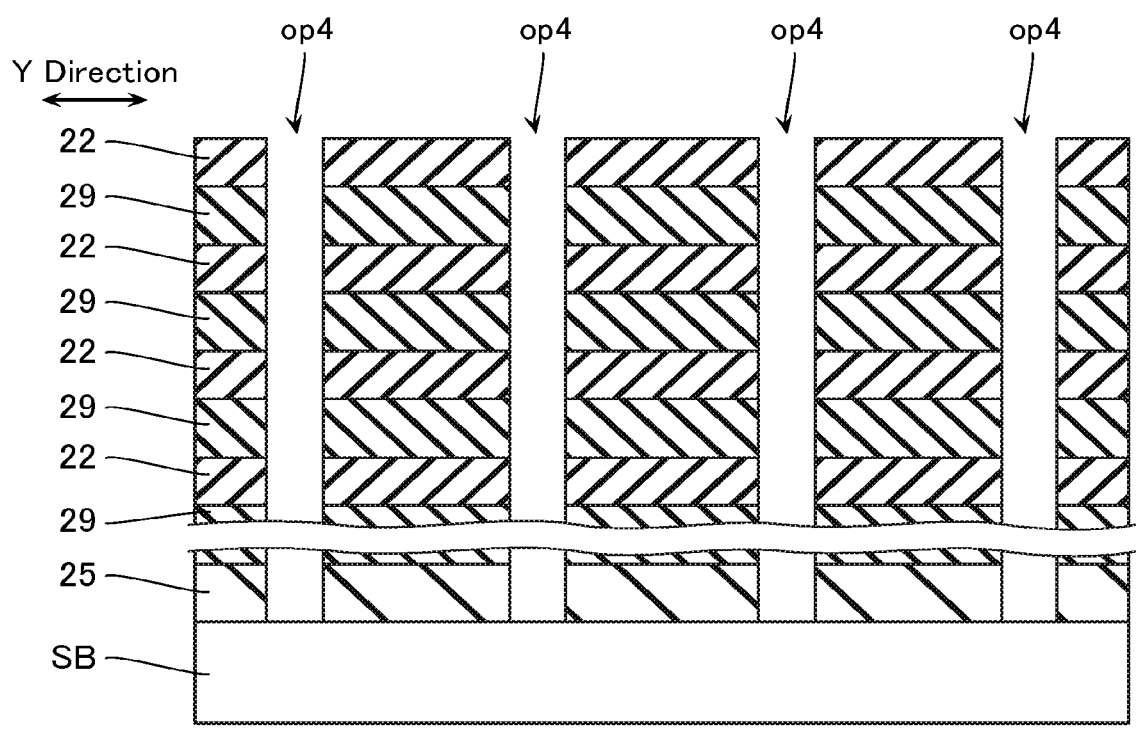
FIG. 38 is a cross-sectional view showing a manufacturing process of the same nonvolatile semiconductor memory device.

Next, as shown in FIG. 38, an opening op4 penetrating the insulating layer 25, the sacrifice layer 29, and the inter-layer insulating layer 22 is formed. The opening op4 will be the memory hole MH.

Figure 39:
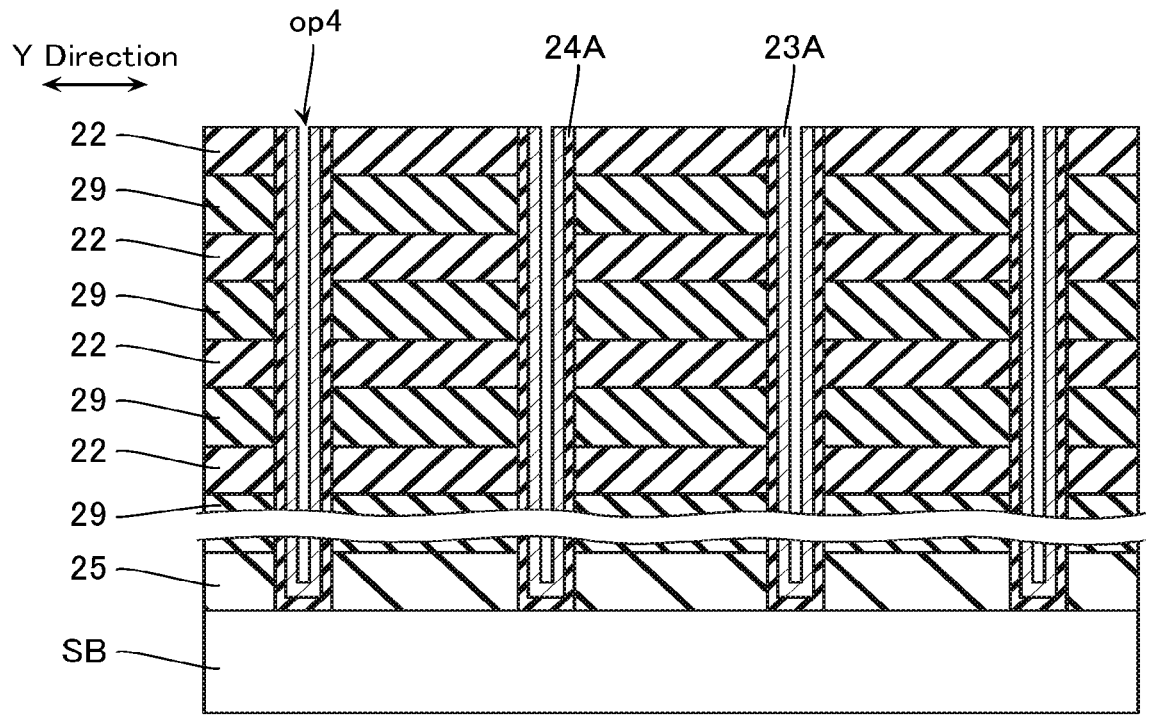
FIG. 39 is a cross-sectional view showing a manufacturing process of the same nonvolatile semiconductor memory device.

Next, as shown in FIG. 39, a memory layer formation layer 24A which will be the memory layer 24 and a semiconductor layer formation layer 23A which will be the semiconductor layer 23 are formed in the opening op4.

Figure 40:
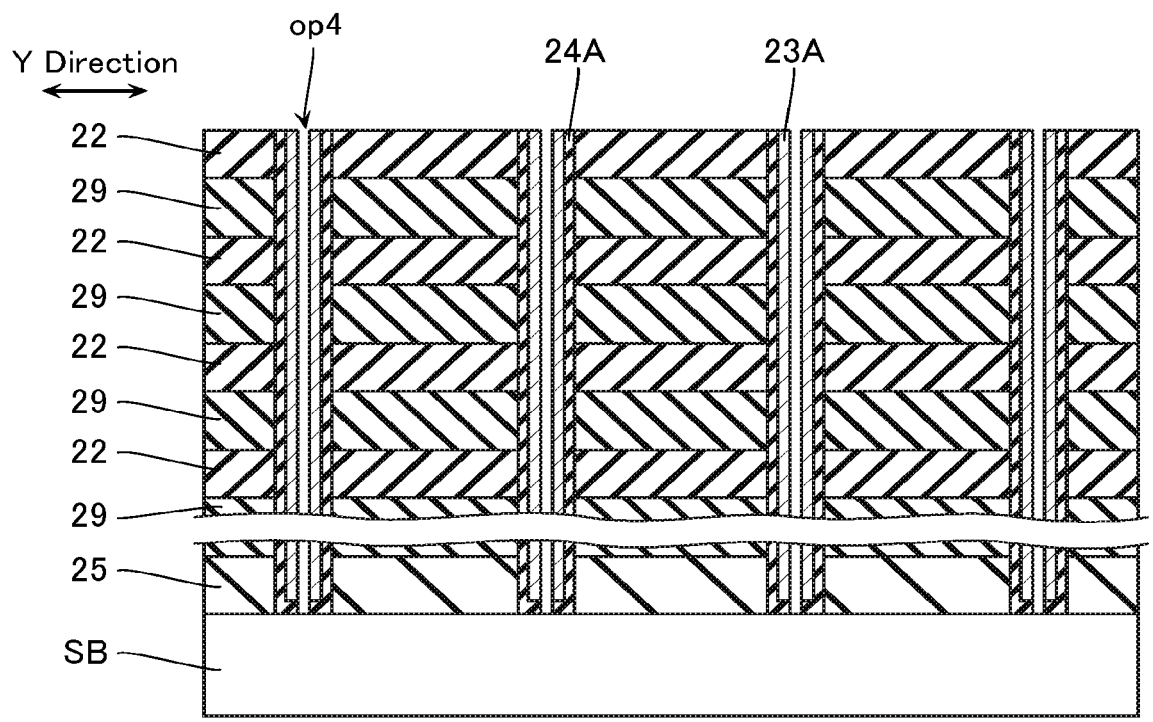
FIG. 40 is a cross-sectional view showing a manufacturing process of the same nonvolatile semiconductor memory device.

Next, as shown in FIG. 40, the memory layer formation layer 24A and the semiconductor layer formation layer 23A are removed at the bottom of the opening op4.

Figure 41:
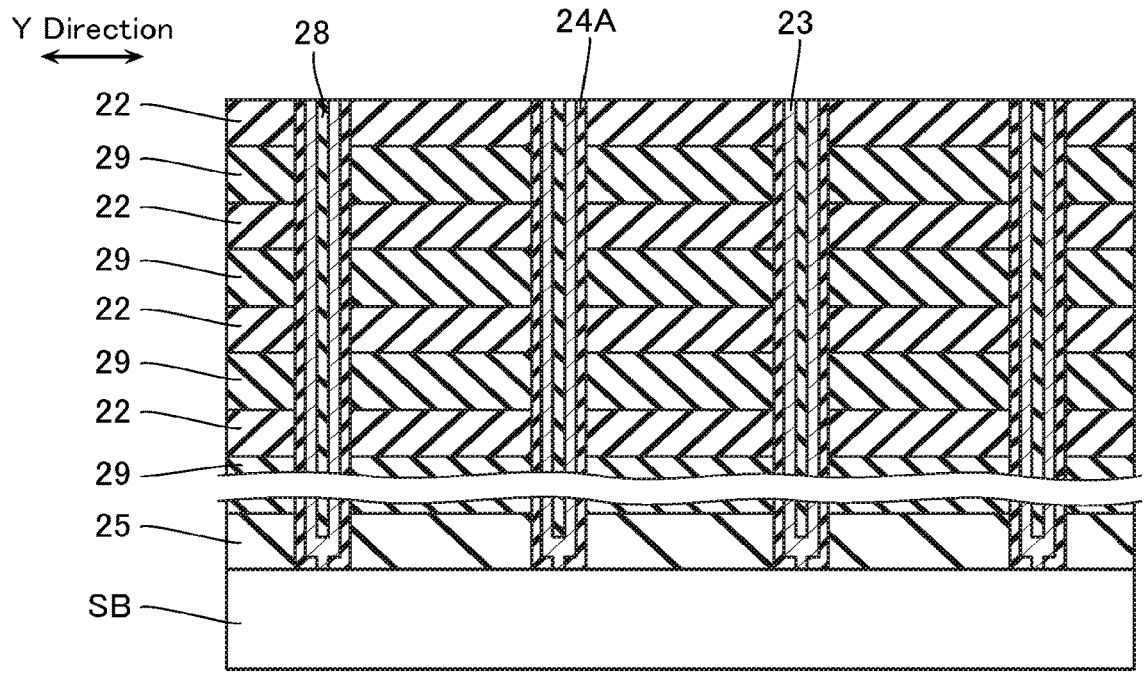
FIG. 41 is a cross-sectional view showing a manufacturing process of the same nonvolatile semiconductor memory device.

Next, as shown in FIG. 41, a semiconductor and the core insulating layer 28 are further formed in the opening op4. As a result, the semiconductor layer 23 electrically connected to the semiconductor substrate SB is formed. The core insulating layer 28 is formed from, for example, silicon oxide (SiO 2).

Figure 42:
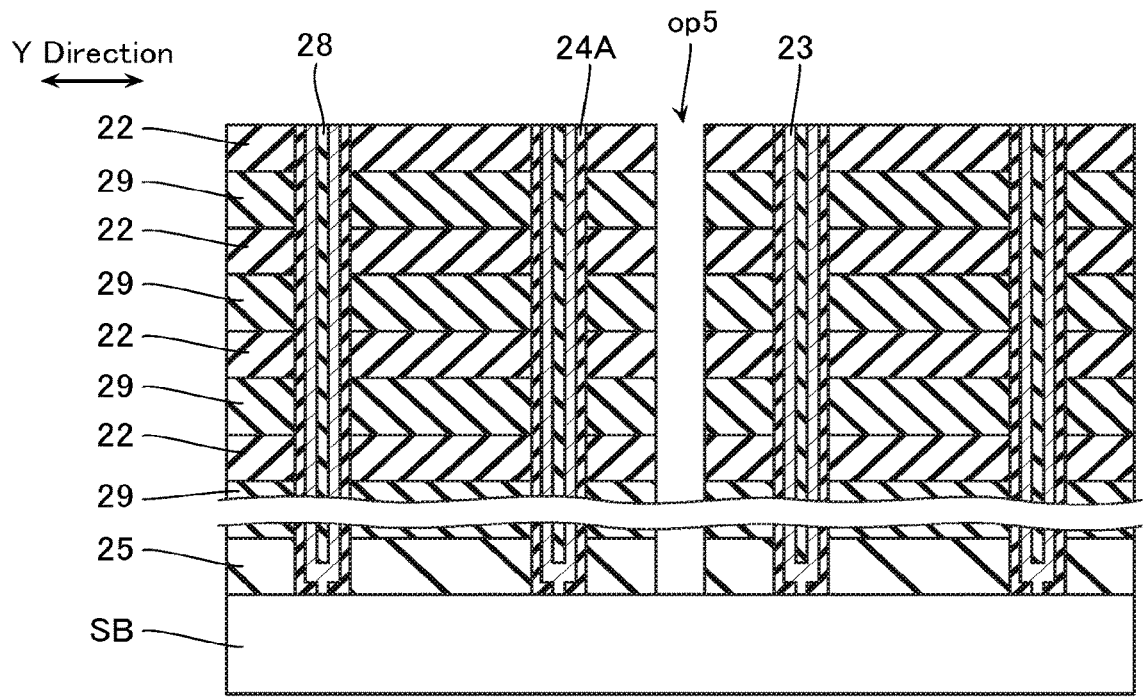
FIG. 42 is a cross-sectional view showing a manufacturing process of the same nonvolatile semiconductor memory device.

Next, as shown in FIG. 42, an opening op5 dividing the insulating layer 25, the sacrifice layer 29, and the inter-layer insulating layer 22 is formed. The opening op5 will be the trench Tb.

Figure 43:
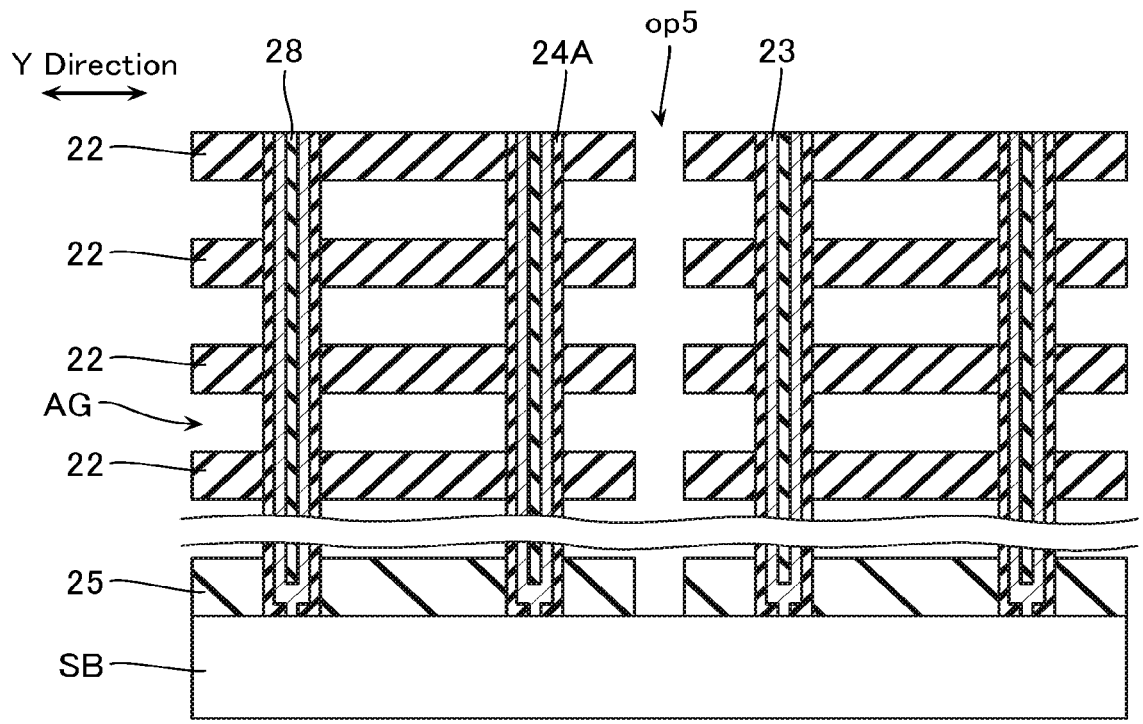
FIG. 43 is a cross-sectional view showing a manufacturing process of the same nonvolatile semiconductor memory device.

Next, as shown in FIG. 43, the sacrifice layer 29 is removed via the opening op5. Removal of the sacrifice layer 29 is performed by, for example, wet etching using a phosphoric acid solution. As a result, an air gap AG is formed between the inter-layer insulating layers 22.

Figure 44:
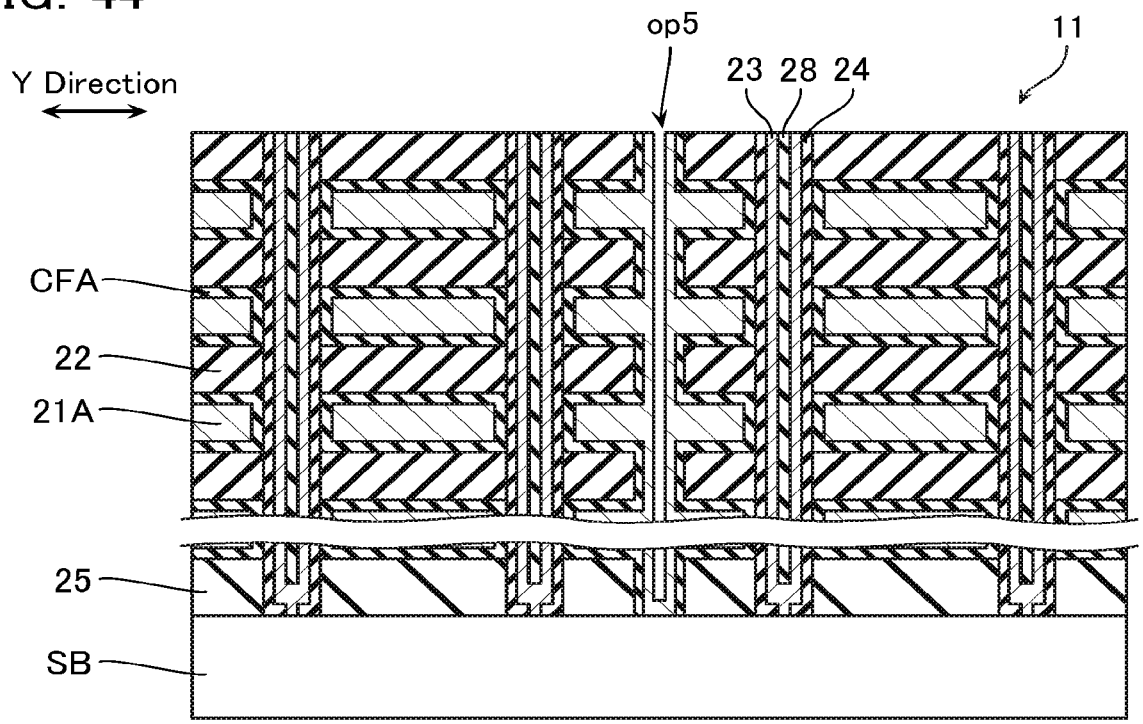
FIG. 44 is a cross-sectional view showing a manufacturing process of the same nonvolatile semiconductor memory device.

Next, as shown in FIG. 44, a stacking film CFA which will be the stacking film CF and a conductive layer 21A which will be the conductive layer 21 (word line WL) are formed via the opening op5.

Figure 45:
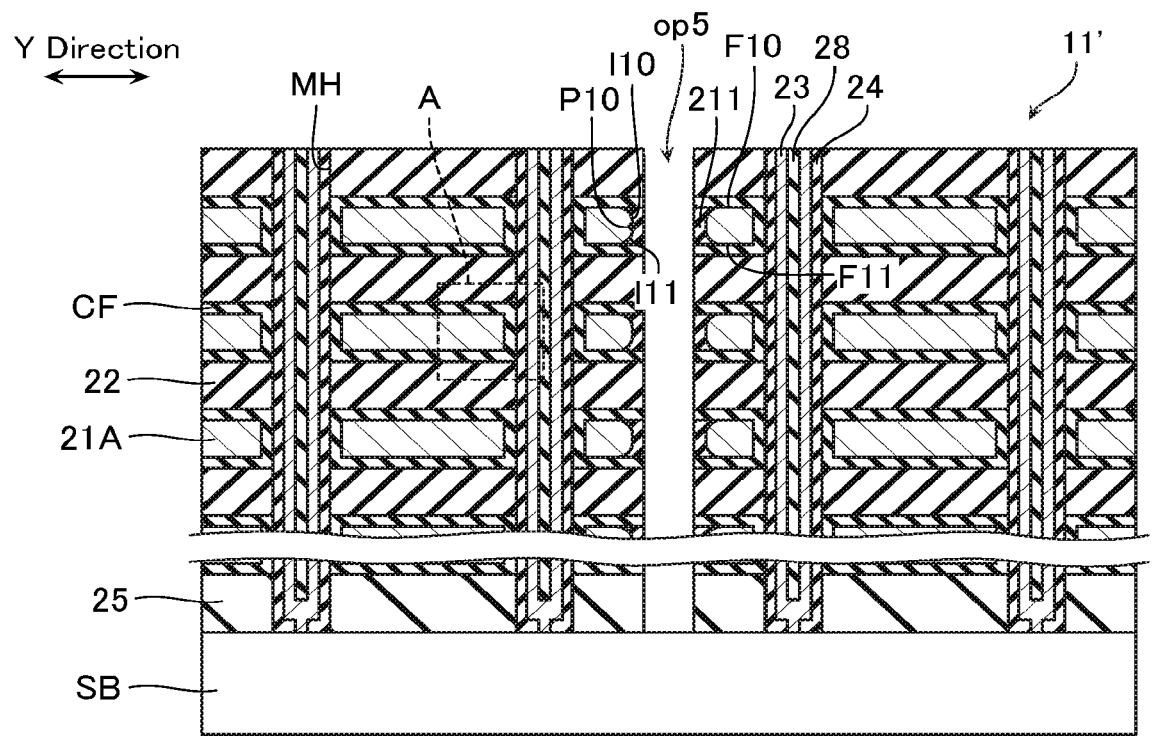
FIG. 45 is a cross-sectional view showing a manufacturing process of the same nonvolatile semiconductor memory device.

Next, as shown in FIG. 45, the stacking film CFA and the conductive layer 21A in the opening op5 are partially removed, and an oxidation treatment is performed. As a result, as shown in FIG. 45, an end exposed in the opening op5 of the conductive layer 21A is oxidized to become the oxide portion 211. Oxidation of the end of the conductive layer 21A proceeds comparatively quickly in a portion close to the opening op5 and close to the upper surface F10 and the lower surface F11, of the conductive layer 21A. Therefore, as shown in FIG. 36, the conductive layer 21A is rounded by the oxidation treatment. That is, the curve 110 joining the tip P10 in the Y direction of the conductive layer 21A and the upper surface F10 of the conductive layer 21A becomes an upwardly convex curve. Similarly, the curve 111 joining the tip P10 in the Y direction of the conductive layer 21A and the lower surface F11 of the conductive layer 21A becomes a downwardly convex curve. Note that in the present embodiment, the curves 110 and 111 have a width of 1 nm or more in the stacking direction. Moreover, in the present embodiment, the curves 110 and 111 have a curvature, and a radius of curvature of these curves 110 and 111 is 20 nm or more.

Subsequently, the inter-layer insulating layer LII and the source contact LI are formed in the opening op5, whereby the nonvolatile semiconductor memory device of the kind shown in FIGS. 34 and 36 is formed.

Other Embodiments

In the third through fifth embodiments, similarly to in the first embodiment, the end in the column direction of the word line conductive layer 41 in the periphery of the insulating layer 47 is rounded as shown in FIG. 6.

However, in, for example, the third through fifth embodiments, similarly to in the comparative example described with reference to FIG. 12, the end in the column direction of the word line conductive layer 41 in the periphery of the insulating layer 47 need not be rounded.

Furthermore, in the first through fifth embodiments, an end in the column direction of the source side conductive layer 51a or drain side conductive layer 51b described with reference to FIGS. 3 and 4 may be rounded.

Figure 46:
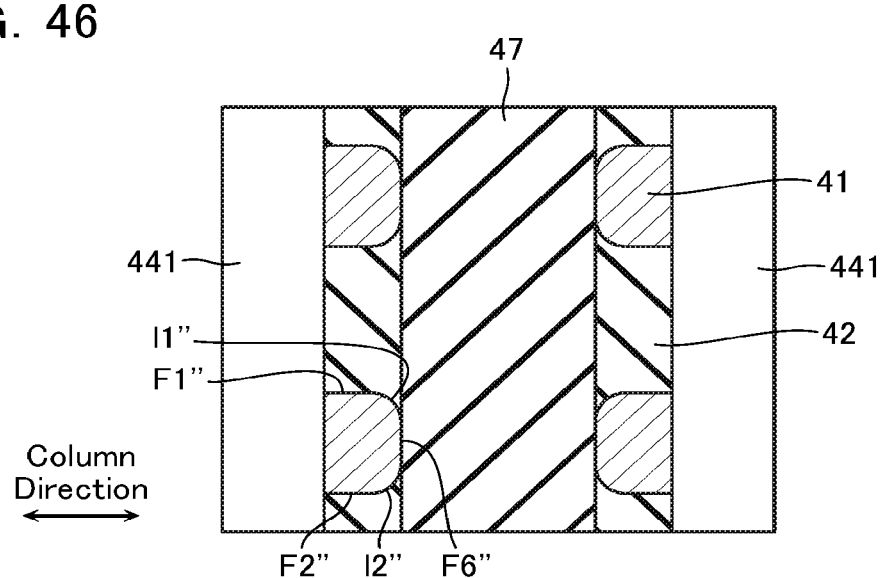
FIG. 46 is a schematic cross-sectional view showing a configuration of part of a nonvolatile semiconductor memory device according to another embodiment.

Moreover, as shown in FIG. 46, an end surface F6" in the column direction of the word line conductive layer 41 may be formed substantially flatly. Furthermore, as shown in FIG. 46, a curve 11" joining the end surface F6" and an upper surface F1" of the word line conductive layer 41 may be configured as an upwardly convex curve. Similarly, a curve 12" joining the end surface F6" and a lower surface F2" of the word line conductive layer 41 may be configured as a downwardly convex curve.

Figure 47:
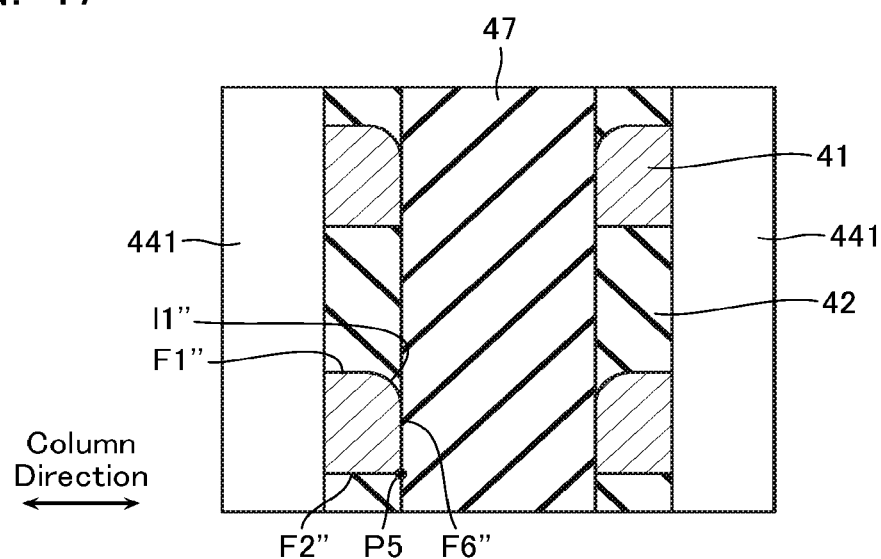
FIG. 47 is a schematic cross-sectional view showing a configuration of part of a nonvolatile semiconductor memory device according to another embodiment.

Moreover, as shown in FIG. 47, the curve 11" joining the end surface F6" and the upper surface F1" may be configured as an upwardly convex curve, and the end surface F6" and the lower surface F2" may be configured to intersect at substantially a single point P5. Similarly, the curve 12" joining the end surface F6" and the lower surface F2" may be configured as a downwardly convex curve, and the end surface F6' and the upper surface F1' may be configured to intersect at substantially a single point.

Moreover, as shown in, for example, FIG. 6, in the first through fifth embodiments, the curves 11 and 12 of the end, among the stacked plurality of word line conductive layers 41, each had a substantially equal curvature.

Figure 48:
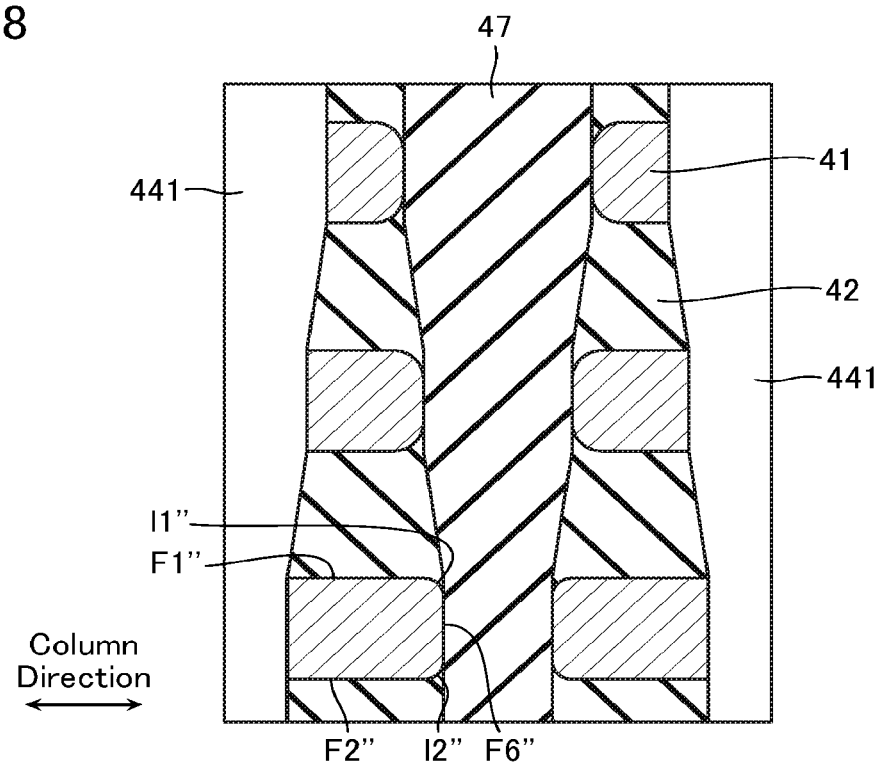
FIG. 48 is a schematic cross-sectional view showing a configuration of part of a nonvolatile semiconductor memory device according to another embodiment.

However, as shown in, for example, FIG. 48, it is possible to configure such that the more upwardly positioned the word line conductive layer 41 is, the larger the radius of curvature of the curves 11 and 12 is, and the more downwardly positioned the word line conductive layer 41 is, the smaller the radius of curvature of the curves 11 and 12 is. In this case, the oxidation treatment is conceivably performed by the likes of dry oxidation or radical oxidation.

Figure 49:
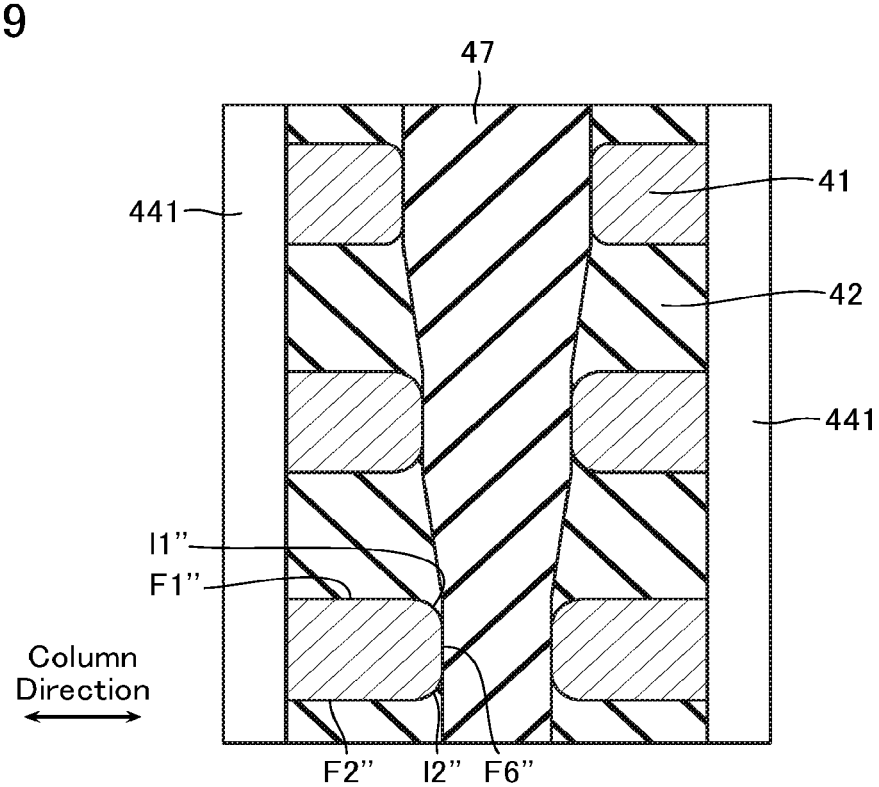
FIG. 49 is a schematic cross-sectional view showing a configuration of part of a nonvolatile semiconductor memory device according to another embodiment.

Moreover, as shown in, for example, FIG. 49, it is possible to configure such that the more upwardly positioned the word line conductive layer 41 is, the smaller the radius of curvature of the curves 11 and 12 is, and the more downwardly positioned the word line conductive layer 41 is, the larger the radius of curvature of the curves 11 and 12 is. Such a mode makes it possible to particularly prevent concentration of an electric field in a downward region where a width in the column direction of the insulating layer 47 narrows, and suitably suppress occurrence of a leak current. Note that in this case, the oxidation treatment is conceivably performed by a method using a cover film of poor coverage and wet oxidation, or the like.

Figure 50:
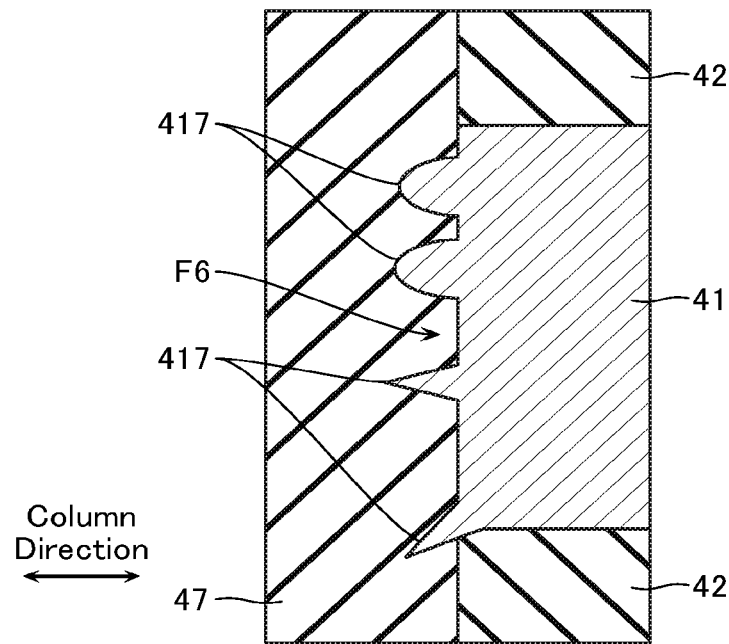
FIG. 50 is a schematic cross-sectional view showing a configuration of part of a nonvolatile semiconductor memory device according to a comparative example.

Moreover, as shown in, for example, FIG. 50, sometimes, roughness of the end surface F6 in the column direction of the word line conductive layer 41 ends up increasing during division, and so on, and a protruding portion 417 gets formed in the end surface F6 in the column direction. Sometimes, in this case, due to presence of the protruding portion 417, concentration of an electric field between two of the word line conductive layers 41 adjacent in the stacking direction further intensifies, and it ends up getting easier for a leak current to occur. Moreover, in the case that, for example, the word line conductive layer 41 has been doped with boron (B), boron sometimes ends up migrating to other configurations.

Figure 51:
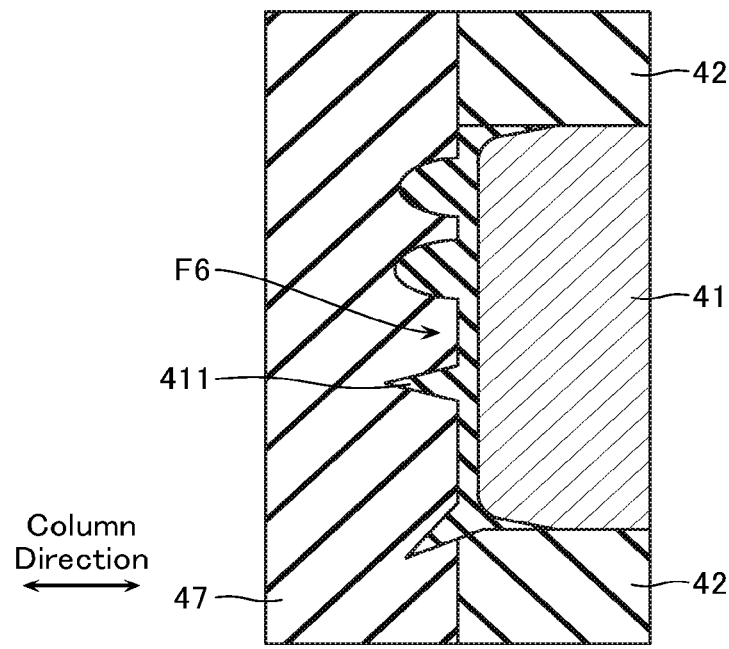
FIG. 51 is a schematic cross-sectional view showing a configuration of part of a nonvolatile semiconductor memory device according to another embodiment.

However, when an oxidation treatment has been performed on the end surface F6 in the column direction of the word line conductive layer 41 as shown in FIG. 51, it is possible to eliminate the influence of roughness of the end surface F6, thereby suppressing the above-mentioned kind of concentration of electric field and suppress occurrence of a leak current. Moreover, in the case that, for example, the word line conductive layer 41 has been doped with boron (B), boron concentration in the oxide portion 411 rises compared to boron concentration in the insulating layer 47. Therefore, it is possible to prevent migration of boron from the word line conductive layer 41 to other configurations.

Note that FIGS. 46 to 51 described the end in the column direction of the word line conductive layer 41 in the periphery of the insulating layer 47. However, each of the modes described with reference to FIGS. 46 to 51 may also be adopted for the end in the column direction of the word line conductive layer 41 in the periphery of the insulating layer 46.

Similarly, FIGS. 46 to 51 described the example in the first embodiment where the memory semiconductor layer 441 is formed in a U shape. However, each of the modes described with reference to FIGS. 46 to 51 may also be adopted for the example in the sixth embodiment.

OTHERS

While certain embodiments of the inventions have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

What is claimed is:

1. A method of manufacturing a semiconductor memory device comprising:
    forming a plurality of first layers and a plurality of second layers alternately stacked in a first direction;
    forming a hole penetrating the plurality of first layers and the plurality of second layers;
    forming a charge accumulation layer and a semiconductor layer in the hole;
    forming a trench penetrating the plurality of first layers and the plurality of second layers;
    removing the plurality of first layers to form a plurality of removed areas at positions corresponding to the plurality of first layers;
    forming a conductive material in the plurality of removed areas and in the trench;
    recessing a part of the conductive material to form a conductive layer facing the semiconductor layer via the charge accumulation layer and having a rounded portion at an end on a side of the trench; and
    forming an insulating material in the trench.

2. The method of manufacturing a semiconductor memory device according to claim 1, wherein
    the rounded portion of the conductive layer has a width of 1 nm or more in the first direction.

3. The method of manufacturing a semiconductor memory device according to claim 1, wherein
    the rounded portion of the conductive layer has a curvature.

4. The method of manufacturing a semiconductor memory device according to claim 3, wherein
    a radius of curvature of the rounded portion of the conductive layer is 20 nm or more.

5. The method of manufacturing a semiconductor memory device according to claim 1, wherein
    the conductive layer has:
    a first surface facing the semiconductor layer via the charge accumulation layer; and
    a second surface including the rounded portion at the end on the side of the trench, and
    the second surface is rounded more than the first surface.

6. The method of manufacturing a semiconductor memory device according to claim 1, wherein the conductive layer has:

a first surface facing the semiconductor layer via the charge accumulation layer; and a second surface including the rounded portion at the end on the side of the trench, and the second surface is rounded more than an upper end and a lower end of the first surface.

7. A method of manufacturing a semiconductor memory device comprising:

forming a plurality of first layers and a plurality of second layers alternately stacked in a first direction;

forming a hole penetrating the plurality of first layers and the plurality of second layers;

forming a charge accumulation layer and a semiconductor layer in the hole;

forming a trench penetrating the plurality of first layers and the plurality of second layers;

removing the plurality of first layers to form a plurality of removed areas at positions corresponding to the plurality of first layers;

forming a conductive material in the plurality of removed areas and in the trench;

recessing a part of the conductive material to form a plurality of conductive layers facing the semiconductor layer via the charge accumulation layer, at least a part of the plurality of conductive layers having rounded portions at ends on a side of the trench; and forming an insulating material in the trench.

8. The method of manufacturing a semiconductor memory device according to claim 7, wherein each of the plurality of conductive layers has one of the rounded portions at an end on the side of the trench.

9. The method of manufacturing a semiconductor memory device according to claim 7, wherein the rounded portions have a width of 1 nm or more in the first direction.

10. The method of manufacturing a semiconductor memory device according to claim 7, wherein the rounded portions have a curvature.

11. The method of manufacturing a semiconductor memory device according to claim 10, wherein a radius of curvature of the rounded portions is 20 nm or more.

12. The method of manufacturing a semiconductor memory device according to claim 7, wherein each of the at least a part of the plurality of conductive layers has:

a first surface facing the semiconductor layer via the charge accumulation layer; and a second surface including the rounded portion at the end on the side of the trench, and the second surface is rounded more than the first surface.

13. The method of manufacturing a semiconductor memory device according to claim 7, wherein each of the at least a part of the plurality of conductive layers has:

a first surface facing the semiconductor layer via the charge accumulation layer; and a second surface including the rounded portion at the end on the side of the trench, and the second surface is rounded more than an upper end and a lower end of the first surface.

* * * * *